(12) United States Patent
Hashimoto et al.

(10) Patent No.: US 9,221,603 B2
(45) Date of Patent: Dec. 29, 2015

(54) PLATE-SHAPED MEMBER STORAGE RACK, PLATE-SHAPED MEMBER TRANSFER FACILITY, AND PLATE-SHAPED MEMBER STORING METHOD

(75) Inventors: Yasuhiko Hashimoto, Kobe (JP); Shigeki Ono, Kobe (JP); Kenji Bando, Kobe (JP)

(73) Assignee: KAWASAKI JUKOGYO KABUSHIKI KAISHA, Kobe-shi (JP)

(*) Notice: Subject to any disclaimer, the term of this patent is extended or adjusted under 35 U.S.C. 154(b) by 292 days.

(21) Appl. No.: 13/811,785

(22) PCT Filed: Aug. 25, 2011

(86) PCT No.: PCT/JP2011/004741
§ 371 (c)(1),
(2), (4) Date: Feb. 27, 2013

(87) PCT Pub. No.: WO2012/026130
PCT Pub. Date: Mar. 1, 2012

(65) Prior Publication Data
US 2013/0156531 A1    Jun. 20, 2013

(30) Foreign Application Priority Data
Aug. 27, 2010    (JP) ................................ 2010-190687

(51) Int. Cl.
*H01L 21/673*    (2006.01)
*B65G 1/04*    (2006.01)

(52) U.S. Cl.
CPC .............. *B65G 1/04* (2013.01); *H01L 21/6734* (2013.01); *H01L 21/67313* (2013.01); *H01L 21/67326* (2013.01)

(58) Field of Classification Search
CPC ............ B65G 1/14; B65G 1/00; B65G 1/023; H01L 21/673; H01L 21/6734; H01L 21/67326; H01L 21/37313

USPC ................. 414/267, 938, 277, 273; 206/711; 211/41.18
See application file for complete search history.

(56) References Cited

U.S. PATENT DOCUMENTS 2,218,115 A * 10/1940 Larkin ......................... 29/281.5
4,566,839 A * 1/1986 Butler ........................... 414/404
(Continued)

FOREIGN PATENT DOCUMENTS

JP    A-55-48073    4/1980
JP    U-62-109488    7/1987
(Continued)

OTHER PUBLICATIONS

Sep. 27, 2011 International Search Report issued in International Patent Application No. PCT/JP2011/004741.

*Primary Examiner* — Ernesto Suarez
*Assistant Examiner* — Ashley Romano
(74) *Attorney, Agent, or Firm* — Oliff PLC

(57) ABSTRACT

A rack includes: a rack main body including a storage space configured to store a plurality of plate-shaped members and a carry-in opening; a plurality of upper supporting portions configured to respectively support upper edge portions of the plurality of plate-shaped members; lower supporting portions respectively provided under the plurality of upper supporting portions and configured to respectively support lower edge portions of the plurality of standing plate-shaped members; and lower edge portion storage portions provided to be each located at an outer side of an end of the upper supporting portion and an end of the lower supporting portion in the arrangement direction and configured to store the lower edge portions of the plate-shaped members, and at least one of the upper supporting portions is configured to be able to support the upper edge portion of the plate-shaped member.

10 Claims, 26 Drawing Sheets

(56) References Cited

U.S. PATENT DOCUMENTS

| | | | |
|---|---|---|---|
| 4,801,168 A * | 1/1989 | Sato | 294/87.1 |
| 5,149,244 A * | 9/1992 | Webber et al. | 414/416.12 |
| 5,269,643 A * | 12/1993 | Kodama et al. | 414/416.02 |
| 5,438,647 A * | 8/1995 | Nagamatsu et al. | 700/247 |
| 5,725,101 A * | 3/1998 | Kakizaki et al. | 206/711 |
| 5,789,890 A * | 8/1998 | Genov et al. | 318/567 |
| 6,206,197 B1 * | 3/2001 | Decamps et al. | 206/711 |
| 6,648,572 B2 * | 11/2003 | Piazza | 414/276 |
| 7,878,754 B2 * | 2/2011 | Mercure | 414/801 |
| 8,215,890 B2 * | 7/2012 | Tseng et al. | 414/274 |
| 8,585,030 B2 * | 11/2013 | Nakashima | 269/303 |

FOREIGN PATENT DOCUMENTS

| | | |
|---|---|---|
| JP | A-11-342986 | 12/1999 |
| JP | A-2002-522238 | 7/2002 |
| JP | A-2009-238904 | 10/2009 |
| WO | WO 00/07780 | 2/2000 |

* cited by examiner

PLATE-SHAPED MEMBER STORAGE RACK, PLATE-SHAPED MEMBER TRANSFER FACILITY, AND PLATE-SHAPED MEMBER STORING METHOD

TECHNICAL FIELD

The present invention relates to a rack for storing plate-shaped members, a plate-shaped member transfer facility including the rack, and a method of storing plate-shaped members in the rack, and particularly to a rack and method for storing large-size heavy-weight plate-shaped members, such as solar panels, liquid crystal panels, and glass plates that are substrates of the solar panels and the liquid crystal panels.

BACKGROUND ART

In plants, such as solar panel production plants, in which a plurality of processing devices for processing plate-shaped members are provided, a facility may be provided, which temporarily stores a plurality of plate-shaped members when the plate-shaped members are conveyed by a conveyor from one processing device to the next processing device. This facility includes a rack or cassette configured to store a plurality of plate-shaped members and a stocker or robot configured to transfer the plate-shaped members between the conveyor and the rack or cassette. A processing device provided behind this facility may be a device configured to process a plurality of plate-shaped members at the same time. Before this processing device starts its operation, a plurality of plate-shaped members stored in the rack or cassette are conveyed to the processing device all at once.

PTL 1 discloses a robot configured to store semiconductor wafers as the plate-shaped members in a cassette and take out the wafers stored in the cassette. An end-effector on which the wafer is mounted is attached to a tip end portion of an arm of the robot. By activating the arm to cause the end-effector to move, the robot stores the wafers or takes out the wafers.

CITATION LIST

Patent Literature

PTL 1: Published Japanese Translation of PCT Application No. 2002-522238

SUMMARY OF INVENTION

Technical Problem

The robot of PTL 1 is directed to small-size light-weight plate-shaped members, such as the semiconductor wafers. Therefore, even if the plate-shaped member is laid and stored in the cassette, no problem occurs. However, if the large-size heavy-weight plate-shaped member, such as the solar panel, is laid in the rack and supported from below at several points, the plate-shaped member may bend by its own weight to be damaged. Even if the plate-shaped member is not damaged, it is necessary to increase an upper-lower interval between the plate-shaped members stored in the rack. Therefore, it is preferable that the large-size heavy-weight plate-shaped member be stored in the rack in a standing posture. With this, the degree of the bending of the plate-shaped member and the interval between the plate-shaped members can be made smaller than a case where the large-size heavy-weight plate-shaped member is stored in the rack in a laid posture. Thus, the maximum number of plate-shaped members the rack can store is increased. It should be noted that in order to store the large-size plate-shaped members in the rack in the standing posture, the plate-shaped member needs to be caused to stand before it is carried in the rack. This is because rotating and displacing the plate-shaped member in the rack is troublesome.

In a case where the plate-shaped member is completely standing when carrying the plate-shaped member in the rack, the plate-shaped member easily falls by the application of an unexpected external force to the plate-shaped member. Moreover, in a case where the plate-shaped member is stored in the rack in a standing but slightly inclined posture, the plate-shaped member bends by its own weight. In a case where the plate-shaped members are bent, and for example, the rack storing the plate-shaped members is conveyed to a subsequent processing device, the conveying operation cannot be performed stably. Therefore, in a conventional process of conveying the stored plate-shaped members to the subsequent processing device, it has been necessary to carry the plate-shaped members by human power of plant workers.

Here, an object of the present invention to provide a plate-shaped member storage rack, plate-shaped member transfer facility, and plate-shaped member storing method, each capable of realizing both stably carrying the plate-shaped members in the rack in the standing posture and stably holding the plate-shaped members stored in the rack in the standing posture.

Solution to Problem

The present invention was made to achieve the above object, and a plate-shaped member storage rack according to the present invention includes: a rack main body including a storage space and a carry-in opening, the storage space being configured to store a plurality of plate-shaped members such that the plurality of plate-shaped members stand and are arranged in an arrangement direction so as to be adjacent to one another in a thickness direction of the plate-shaped member, the carry-in opening being an opening through which the plate-shaped members are carried in the storage space in a horizontal carry-in direction intersecting with the arrangement direction; a plurality of upper supporting portions provided in the storage space in the arrangement direction when viewed from the carry-in direction and configured to respectively support upper edge portions of the plurality of plate-shaped members; lower supporting portions provided in the storage space to be respectively located under the plurality of upper supporting portions and configured to respectively support lower edge portions of the plurality of standing plate-shaped members; and lower edge portion storage portions provided in the storage space to be each located at an outer side of an end of the upper supporting portion and an end of the lower supporting portion in the arrangement direction and configured to respectively store the lower edge portions of the plate-shaped members carried in the storage space through the carry-in opening, wherein at least one of the upper supporting portions is configured to be able to support the upper edge portion of the plate-shaped member, which has been carried in the storage space and whose lower edge portion is stored in the lower edge portion storage portion, in a state where the plate-shaped member is inclined.

According to the above configuration, the lower edge portion storage portion is located further from the upper supporting portion than the lower supporting portion in the arrangement direction. Therefore, in a case where the upper edge portion of the plate-shaped member is supported by the upper supporting portion, the inclination of the plate-shaped member when the lower edge portion of the plate-shaped member is supported by the lower supporting portion is smaller than that when the lower edge portion of the plate-shaped member is stored in the lower edge portion storage portion, so that the plate-shaped member stands in a posture closer to a vertical posture. By causing the lower edge portion of the plate-shaped member to be stored in the lower edge portion storage portion during a carry-in operation, the plate-shaped member becomes a slightly inclined posture, so that the carry-in operation can be stably performed. By causing the lower supporting portion to support the plate-shaped member having been carried in the storage space, the plate-shaped member can be caused to stand in a posture close to the vertical posture. By causing the plate-shaped member to stand in a posture closer to the vertical posture, the plate-shaped member can be held stably. For example, the plate-shaped member stored in the storage space can be prevented from bending.

The plate-shaped member storage rack may further includes: the upper supporting portions; and restraining members respectively provided at the same positions as the upper supporting portions in the arrangement direction when viewed from the carry-in direction, wherein each of the restraining members may be provided at the rack main body so as not to be engaged with the plate-shaped member when the lower edge portion of the plate-shaped member is being stored in the lower edge portion storage portion and so as to restrain the upper edge portion of the plate-shaped member when the lower edge portion of the plate-shaped member is being supported by the lower supporting portion. With this, in a state where the lower edge portion of the plate-shaped member is supported by the lower supporting portion, the upper edge portion of the plate-shaped member can be restrained by the restraining member provided at the rack main body. Therefore, the plate-shaped member stored in the rack main body can be held further stably.

Each of the restraining members may include a pair of restraining pieces spaced apart from each other in the arrangement direction, and the upper edge portion of the plate-shaped member supported by the lower supporting portion may be fitted in a restraining groove formed between the pair of restraining pieces to be restrained by the pair of restraining pieces. The pair of restraining pieces may respectively include opposed surfaces opposed to each other, and a tapered surface may be formed on a lower end portion of at least one of the pair of opposed surfaces such that a size of the restraining groove in the arrangement direction increases toward a lower direction. With this, the upper edge portion of the plate-shaped member is easily introduced in the restraining groove, and the upper edge portion of the plate-shaped member can be surely restrained.

The lower edge portion storage portions may be located lower than the lower supporting portions. With this, it is possible to easily realize a structure in which the restraining member and the plate-shaped member are not engaged with each other when the lower edge portion of the plate-shaped member is stored in the lower edge portion storage portion, and the plate-shaped member is restrained by the restraining member when the lower edge portion of the plate-shaped member is supported by the lower supporting portion.

The lower supporting portions may respectively include grooves with which the lower edge portions of the plate-shaped members are respectively engaged. With this, when the lower edge portion of the plate-shaped member is supported by the lower supporting portion, the lower edge portion can be engaged with the groove. Therefore, the plate-shaped member stored in the rack main body can be held further stably.

The number of lower supporting portions may correspond to the number of plate-shaped members the storage space is able to store, the lower supporting portions, the number of which corresponds to the number of plate-shaped members the storage space is able to store, may be divided into one or more groups each including two or more lower supporting portions sequentially arranged in the arrangement direction, and the groups may be provided so as to correspond one-to-one to the lower edge portion storage portions. With this, it becomes unnecessary to provide the lower edge portion storage portions, the number of which is equal to the number of plate-shaped members the rack main body can store. Therefore, the sizes of the rack main body and storage space can be reduced in the arrangement direction.

The plate-shaped member storage rack may further include a posture changing mechanism including supporting bodies provided to be able to move up and down, wherein the posture changing mechanism may cause the supporting bodies to be located in the lower edge portion storage portions, cause the supporting bodies to support the lower edge portion of the plate-shaped member which is to be carried in the storage space through the carry-in opening, lift up the plate-shaped member, having been carried in the storage space, from below, and cause the supporting bodies to move such that a state where the lower edge portion of the plate-shaped member is supported by the supporting bodies is changed to a state where the lower edge portion of the plate-shaped member is supported by the lower supporting portion. With this, by activating the posture changing mechanism, a state where the lower edge portion of the plate-shaped member carried in the storage space is stored in the lower edge portion storage portion can be automatically changed to a state where the lower edge portion is supported by the lower supporting portion.

The posture changing mechanism may be provided at a lower portion of the rack main body and be configured to be able to cause the plate-shaped member, supported by the upper supporting portion and the lower supporting portion, to move in the arrangement direction. With this, a mechanism for carrying the plate-shaped member in the storage space and a mechanism for changing the posture of the plate-shaped member carried in the storage space are integrated, so that the configuration of the plate-shaped member storage rack is simplified.

The posture changing mechanism may include a first driving portion configured to cause the supporting body to move in an upper-lower direction and a second driving portion configured to cause the supporting body to move in the arrangement direction. With this, by activating the first driving portion in a state where the lower edge portion of the plate-shaped member stored in the storage space is supported by the supporting bodies, the plate-shaped member is lifted up from below, so that the lower edge portion of the plate-shaped member can be released from the lower edge portion storage portion. Next, by activating the second driving portion, the lower edge portion of the plate-shaped member can be moved in the arrangement direction. Further, by activating the first driving portion, the plate-shaped member is lowered, and the lower edge portion of the plate-shaped member can be supported by the lower supporting portion.

The plate-shaped member storage rack may further include a base configured to slidably support a bottom portion of the rack main body. With this, the rack main body storing the plate-shaped members can be moved. As above, the plate-shaped members are stably held in the storage space. Therefore, the possibility of the generation of vibration of the plate-shaped members is reduced, so that the plate-shaped members can be easily, safely conveyed.

A plate-shaped member transfer facility according to the present invention includes the plate-shaped member storage rack and a transfer device configured to carry the plate-shaped members in the plate-shaped member storage rack and carry the plate-shaped members out from the plate-shaped member storage rack.

A plate-shaped member storing method according to the present invention is a method of storing plate-shaped members in a plate-shaped member storage rack, the plate-shaped member storage rack including a rack main body including a storage space and a carry-in opening, the storage space being configured to store a plurality of plate-shaped members such that the plurality of plate-shaped members stand and are arranged in an arrangement direction so as to be adjacent to one another in a thickness direction of the plate-shaped member, the carry-in opening being an opening through which the plate-shaped members are carried in the storage space in a horizontal carry-in direction intersecting with the arrangement direction, a plurality of upper supporting portions provided in the storage space in the arrangement direction when viewed from the carry-in direction and configured to respectively support upper edge portions of the plurality of plate-shaped members, lower supporting portions provided in the storage space to be respectively located under the plurality of upper supporting portions and configured to respectively support lower edge portions of the plurality of standing plate-shaped members, and lower edge portion storage portions provided in the storage space to be each located at an outer side of an end of the upper supporting portion and an end of the lower supporting portion in the arrangement direction and configured to respectively store the lower edge portions of the plate-shaped members carried in the storage space through the carry-in opening, the method including the steps of carrying the plate-shaped member in the storage space through the insertion opening in the carry-in direction such that the upper edge portion of the standing plate-shaped member is supported by the upper supporting portion, and the lower edge portion of the plate-shaped member is stored in the lower edge portion storage portion; lifting up the plate-shaped member, having been stored in the storage space, from the lower edge portion storage portion; causing the lower edge portion of the plate-shaped member to move in the arrangement direction; and lowering the plate-shaped member to cause the lower supporting portion to support the lower edge portion of the plate-shaped member.

As with the plate-shaped member storage rack, according to the plate-shaped member transfer facility and method, both stably conveying the plate-shaped members in the standing posture and stably holding the plate-shaped members, stored in the rack, in the standing posture can be realized.

Advantageous Effects of Invention

The present invention can realize both stably conveying the plate-shaped members in the standing posture and stably holding the plate-shaped members, stored in the rack, in the standing posture. The above object, other objects, features and advantages of the present invention will be made clear by the following detailed explanation of preferred embodiments with reference to the attached drawings.

DESCRIPTION OF EMBODIMENTS

Figure 1:
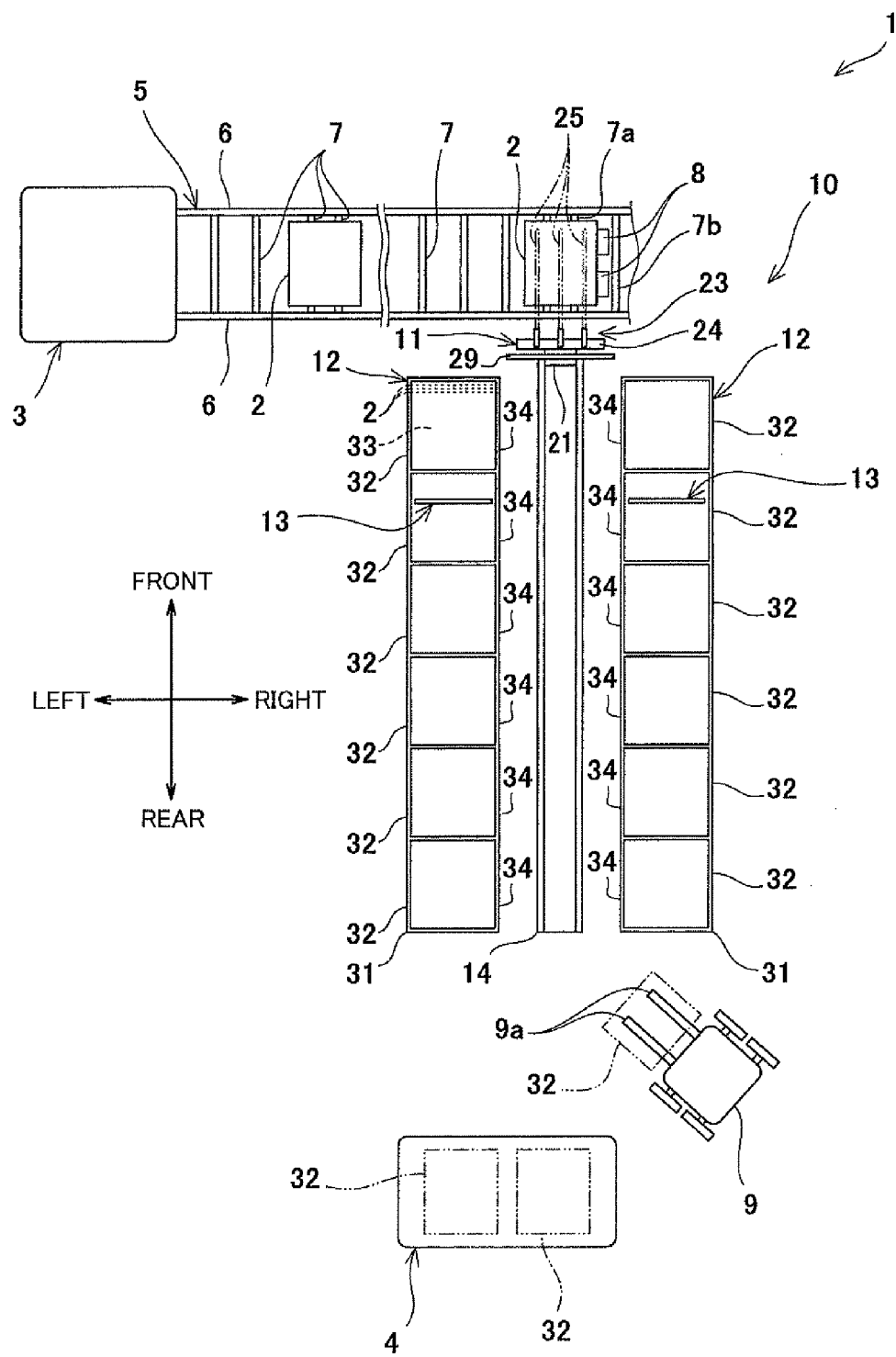
FIG. 1 is a schematic plan view showing a transfer facility according to an embodiment of the present invention.

Hereinafter, an embodiment of the present invention will be explained in reference to the drawings. In the drawings, the same reference signs are used for the same or corresponding components, and a repetition of the same explanation is avoided.

[Transfer Facility]

As shown in FIG. 1, a plate-shaped member transfer facility 10 (hereinafter referred to as a "transfer facility") according to the present embodiment is provided in, for example, a plant 1 for producing a solar panel that is one example of a plate-shaped member. In the plant 1, a plurality of processing devices (only two devices 3 and 4 are shown in FIG. 1) configured to process a glass plate 2 that is a substrate of the solar panel are provided.

The transfer facility 10 is provided close to a conveyor 5 configured to convey the glass plate 2 having been subjected to the processing of the processing device 3 and temporarily stores the glass plate 2 conveyed from the conveyor 5. The conveyor 5 includes a plurality of wheel axles 7 each provided between a pair of girders 6 extending in parallel with each other from the processing device. The wheel axles 7 are provided at intervals along a direction in which the girders 6 extend. The glass plates 2 having been processed by the processing device 3 are mounted on the wheel axles 7 one by one. When the wheel axles 7 are rotated, the glass plate 2 is conveyed in the direction in which the girders extend. When the glass plate 2 contacts stoppers 8 provided between two adjacent wheel axles 7a and 7b, the glass plate 2 is positioned and stopped at a predetermined stop position.

The transfer facility 10 includes a track robot 11 and plate-shaped member storage racks 12 (hereinafter referred to as "racks"). The track robot 11 receives the glass plate 2 located at the stop position, causes the glass plate 2 to stand, and carries the glass plate 2 in the rack 12. The rack 12 stores the glass plate 2, carried in by the track robot 11, in a standing state. The track robot 11 can also carry out the glass plate 2 stored in the rack 12. The rack 12 of the present embodiment includes a rack robot 13, and the rack robot 13 carries the glass plate 2 in and out in cooperation with the track robot 11. As described below, the rack robot 13 constitutes a posture changing mechanism configured to change the posture of the plate-shaped member.

The processing device 4 provided behind the transfer facility 10 is generally a device configured to process a plurality of glass plates 2 at the same time. One example of the processing device 4 is a furnace configured to perform a heat treatment or a pasting treatment. Before the processing device 4 starts its operation, the plurality of glass plates 2 stored in the rack 12 of the transfer facility 10 are conveyed to the processing device 4 all at once.

As described below, the transfer facility 10 of the present embodiment includes lower supporting portions 63 (see FIG. 5) each configured to support a lower edge portion of the glass plate 2 and lower edge portion storage portions 64 (see FIG. 5) each configured to store the lower edge portion of the glass plate 2. When carrying the glass plate 2 in the rack 12, the lower edge portion storage portion 64 is caused to store the lower edge portion of the glass plate 2. With this, the glass plate 2 becomes a slightly inclined standing posture. After the glass plate 2 is carried in the rack 12, the lower supporting portion 63 is caused to support the lower edge portion of the glass plate 2. With this, the glass plate 2 can be stored in a standing posture closer to an upright posture. Therefore, both stably carrying the glass plates 2 in and stably holding the glass plates 2 can be achieved. Thus, when conveying the glass plates 2 to the processing device 4, a main body 32 storing the plurality of glass plates 2 can be stably conveyed. With this, the conveying operation can be quickly, easily performed. Hereinafter, the configuration and actions will be explained in detail.

Figure 2:
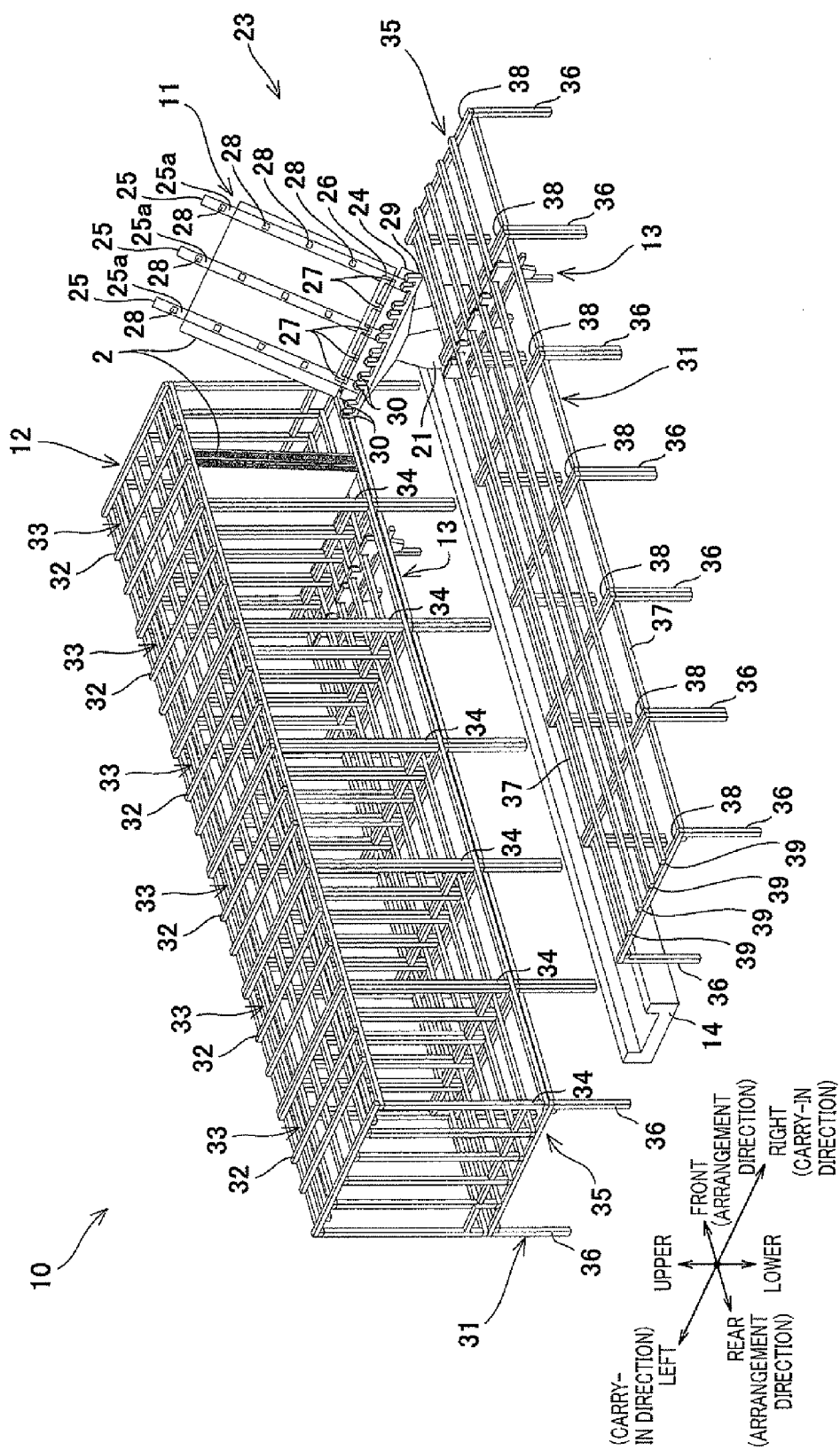
FIG. 2 is a perspective view of the transfer facility shown in FIG. 1.

FIG. 2 is a perspective view of the transfer facility 10 shown in FIG. 1. For ease of explanation, in FIGS. 2 and 4, a rack main body of the rack 12 located on the right side is omitted. As shown in FIG. 2, a guide rail 14 extending in a front-rear direction is provided on a floor surface of the plant 1. A bottom portion of a base 21 of the track robot 11 is supported by the guide rail 14 so as to be slidable in the front-rear direction. An end-effector 23 is coupled to an upper front portion of the base 21 so as to be able to swing about an axis extending in a left-right direction. The end-effector 23 is configured such that a beam 24 extending in the left-right direction is coupled to the base 21 so as to be able to swing, and three fangs 25 are attached to the beam 24 so as to be located at regular intervals in the left-right direction. Each of the fangs 25 has a long flat plate shape, and a base end portion thereof is fixed to a rear surface of the beam 24. A lift bar 26 is provided on the three fangs 25 of the end-effector 23 in the left-right direction. The lift bar 26 can slide along surfaces 25a of the fangs 25, each of the surfaces 25a being one of a pair of flat surfaces of each fang 25 and being opposite to a surface fixed to the beam 24. A plurality of supporting blocks 27 arranged in the left-right direction project from a surface of the lift bar 26. A plurality of rollers 28 are provided on the surface 25a of each fang 25 at intervals in the longitudinal direction so as to be able to roll. A part of a surface of each roller 28 projects from the surface 25a of the fang 25. A roller beam 29 extending in the left-right direction is fixed to an upper rear portion of the base 21. A plurality of rollers 30 are provided on the roller beam 29 at intervals in the left-right direction so as to be each rotatable about an axis extending in the front-rear direction. A groove is formed on an axially intermediate portion of an outer peripheral surface of each roller 30 so as to extend along the entire periphery in the circumferential direction.

The track robot 11 includes: a track actuator 91 (see FIG. 11), such as a servo motor, configured to cause the base 21 to move in the front-rear direction; a flip actuator 92 (see FIG. 11), such as a servo motor, configured to cause the end-effector 23 to swing; a pneumatic lift actuator 93 (see FIG. 11) configured to cause the lift bar 26 to move along a direction in which the fangs 25 extend; and a roller actuator 94 (see FIG. 11), such as a servo motor, configured to cause the rollers 30 to rotate. By the operation of the flip actuator 92, the fangs 25 become such a posture (see a chain double-dashed line in FIG. 1) as to horizontally extend from the beam 24 in the front direction or becomes such a posture (see a solid line in FIG. 1) as to stand on the beam 24 in the upper direction. When the lift bar 26 moves, it maintains such a posture as to extend in the left-right direction. The guide rail 14, the fangs 25, and the roller beam 29 may be hollow so as to respectively accommodate the actuators 91, 93, and 94.

The end-effector 23 of the track robot 11 can swing to lift from below and receive the laid-posture glass plate 2, which has been conveyed to the stop position by the conveyor 5 (see FIG. 1), and to cause the glass plate 2 to stand on the supporting blocks 27 of the lift bar 26. The base 21 can move to convey the standing glass plate 2 in the front-rear direction. The lift bar 26 can be lowered to mount the lower end portion of the glass plate 2 on the rollers 30. The rollers 30 can rotate to cause the glass plate 2 on the rollers 30 to slide in the left or right direction. With this, the glass plate 2 in the standing state can be carried in either of the left-side and right-side racks 12 arranged to sandwich the guide rail 14.

[Rack]

As shown in FIG. 2, the rack 12 includes a base 31 provided on the floor surface of the plant 1 and the rack main bodies 32 supported on the base 31. The base 31 is long in the front-rear direction, and a plurality of rack main bodies 32 (six rack main bodies 32 in FIG. 2) are arranged on the base 31 to be lined up in the front-rear direction. Each of the rack main bodies 32 includes a storage space 33 therein and a carry-in opening 34 on a side surface thereof facing the track robot 11. The storage space 33 can store a plurality of glass plates 2 such that the glass plates 2 stand and are arranged in the front-rear direction (arrangement direction) so as to be adjacent to one another in a thickness direction of the glass plate 2. The carry-in opening 34 is an opening through which the glass plate 2 transferred from the track robot 11 is carried in the storage space 33 along a horizontal left or right direction (carry-in direction) intersecting with the arrangement direction. The glass plate 2 stored in the storage space 33 is carried out therefrom through the carry-in opening 34. In the case of the rack 12 located on the left side, the left direction is the carry-in direction.

(Frame Structure)

The base 31 includes a bed portion 35 supported by the floor surface of the plant 1 via a plurality of legs 36, and the bed portion 35 is horizontally arranged above the floor surface. The bed portion 35 of the present embodiment includes a rectangular parallel-cross frame structure. Specifically, the bed portion 35 includes a pair of joists 37 extending parallel to the front-rear direction. A plurality of cross girders 38 extending in the left-right direction are fixed to upper surfaces of the pair of joists 37 so as to be arranged at intervals in the front-rear direction. A plurality of vertical girders 39 are provided on upper surfaces of the cross girders 38 so as to be located between the pair of joists 37 and arranged at intervals in the left-right direction. Each of the vertical girders 39 is provided perpendicular to the plurality of cross girders 38 and fixed to the upper surfaces of the cross girders 38. Left end portions of the cross girders 38 project from the left joist 37 in the left direction, and right end portions of the cross girders 38 project from the right joist 37 in the right direction. The legs 36 respectively extends in the lower direction from the end portions of the cross girders 38.

Figure 3:
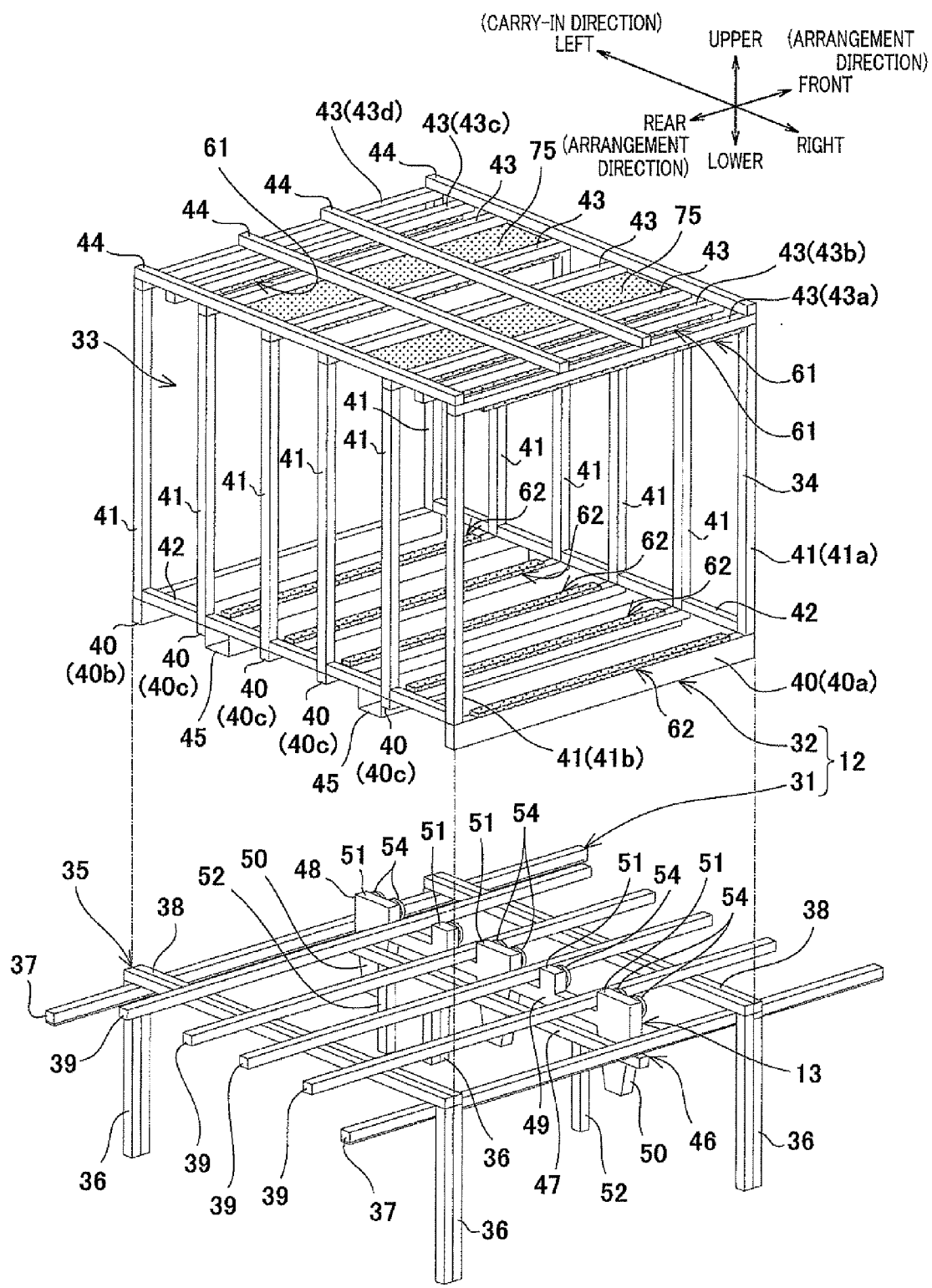
FIG. 3 is an exploded perspective view showing a part of a left-side rack shown in FIG. 2.

FIG. 3 is an exploded perspective view of the rack 12. As shown in FIG. 3, the rack main body 32 of the present embodiment includes a rectangular-solid basket-shaped or cage-shaped frame structure. Specifically, the rack main body 32 includes a plurality of bottom vertical girders 40 extending in the front-rear direction. Posts 41 extending in the upper direction are respectively coupled to front and rear end portions of the bottom vertical girders 40. A plurality of posts 41 are arranged at each of front and rear portions of the rack main body 32 in the left-right direction in a fence shape. A pair of front and rear joists 42 extending in the left-right direction are arranged at lower portions of the posts 41 so as to penetrate the posts 41 arranged in the left-right direction. Upper vertical girders 43 extending in the front-rear direction are each provided on upper end portions of a pair of posts 41, opposed to each other in the front-rear direction, so as to respectively overlap the bottom vertical girders 41 in plan view. A plurality of upper cross girders 44 are provided on upper surfaces of the upper vertical girders 43 at intervals in the front-rear direction. Each of the cross girders 44 extends in the left-right direction so as to be perpendicular to a plurality of upper vertical girders 43 and fixed to the upper surfaces of the upper vertical girders 43. In addition to the upper vertical girders 43 coupled to the posts 41, a plurality of additional upper vertical girders 43 are provided on lower surfaces of the upper cross girders 44. With this, without excessively increasing the number of posts 41, a variety of members, such as upper supporting portions 61 and restraining members 75, can be attached to an upper portion of the rack main body 32. A pair of left and right fork pockets 45 extending in the front-rear direction are provided on lower surfaces of a pair of joists 42. Each of the fork pockets 45 is formed to have a tubular shape.

The storage space 33 is formed in the rack main body 32 including the above frame structure. Left and right portions of the storage space 33 of the rack main body 32 are open and constitute the carry-in opening 34 of the rack main body 32. Specifically, a rectangular opening through which the storage space 33 opens is defined by two vertical girders 40a and 43a extending in the front-rear direction at an end edge facing the track robot 11 and two posts 41a and 41b respectively connecting front end portions of the vertical girders 40a and 43a each other and rear end portions of the vertical girders 40a and 43a each other in the upper-lower direction. This opening serves as the carry-in opening 34.

Figure 4:
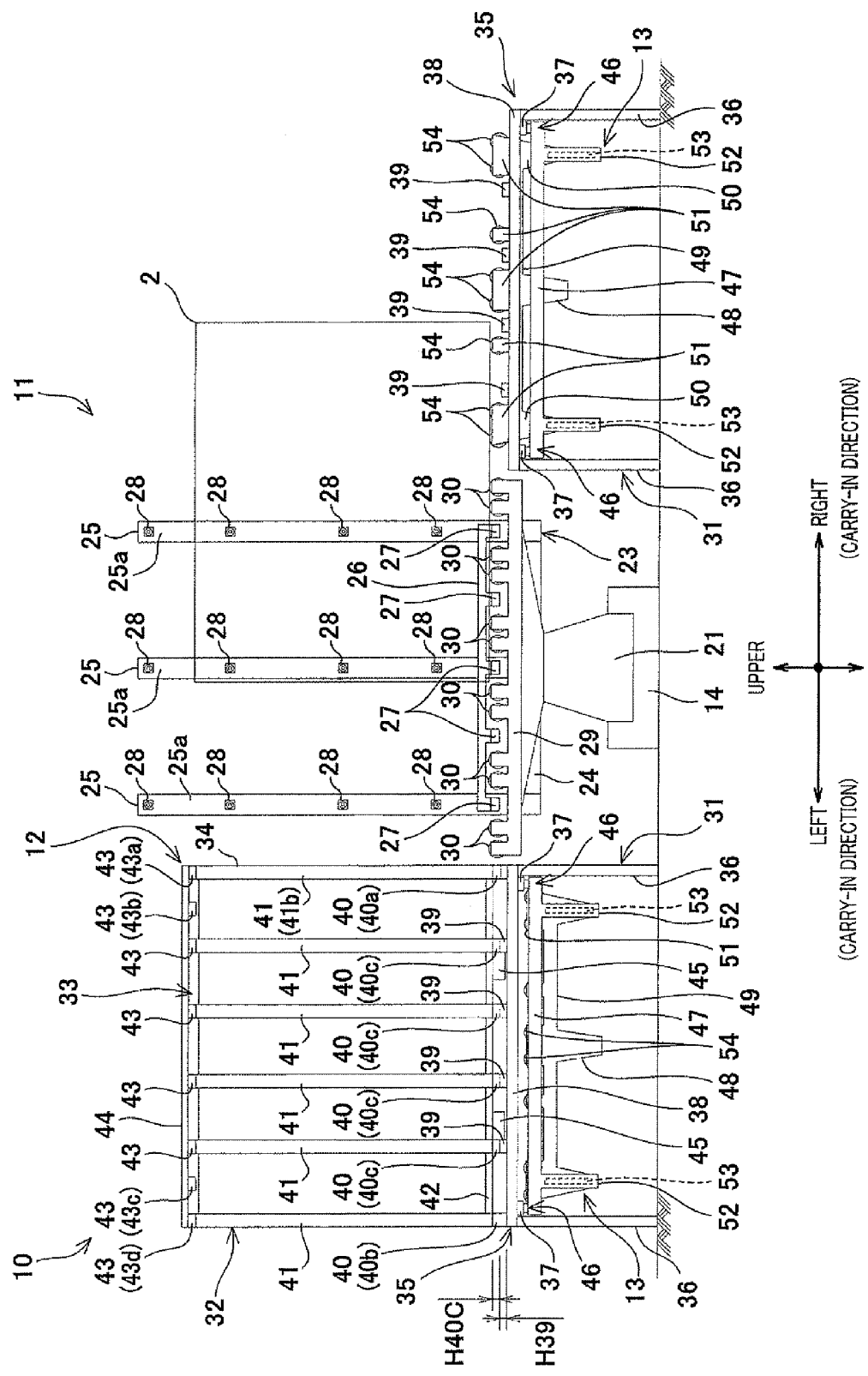
FIG. 4 is a diagram showing the transfer facility shown in FIG. 2 when viewed from the back.

As shown in FIG. 4, the rack main body 32 is attached to the base 31 in such a manner that the bottom vertical girders 40 are supported on the bed portion 35. In this case, front and rear end portions of bottom vertical girders 40a and 40b provided at left and right end edges among the bottom vertical girders 40 are supported on the cross girders 38 of the bed portion 35. Bottom vertical girders 40c provided between the bottom vertical girders 40a and 40b are respectively, entirely supported on the vertical girders 39 of the bed portion 35 in the front-rear direction. Since the vertical girders 39 of the bed portion 35 are fixed to the cross girders 38 as described above, upper surfaces of the vertical girders 39 are located higher than upper surfaces of the cross girders 38 by a height H39 of the vertical girder 39. On this account, lower surfaces of the bottom vertical girders 40a and 40b are located lower than lower surfaces of the bottom vertical girders 40c by the height H39. With this, the difference in height between the vertical girder 39 and the cross girder 38 is canceled.

By the difference in height between the vertical girder 39 and cross girder 38 of the bed portion 35, a space is formed between the posts 41 of the rack main body 32 and the cross girders 38 of the bed portion 35. The height of this space corresponds to a sum of the height H39 of the vertical girder 39 of the bed portion 35 and a height H40c of the bottom vertical girder 40c supported on the vertical girder 39. The fork pockets 45 are reasonably provided in this space having the above height. In a state where the rack main body 32 is detachably supported by the bed portion 35, forks 9a (see FIG. 1) of a forklift 9 (see FIG. 1) are respectively inserted in the fork pockets 45 to be moved in the upper direction. With this, the rack main body 32 can be easily detached from the bed portion 35 in the upper direction.

(Rack Robot)

As shown in FIGS. 3 and 4, a base 47 of the rack robot 13 is provided at lower surface sides of the pair of joists 37 of the bed portion 35 via a translation mechanism 46. The base 47 of the rack robot 13 is formed to have a long bar shape, and a longitudinal direction thereof corresponds to the left-right direction. The translation mechanism 46 is constituted by, for example, racks and pinions. In this case, a pair of left and right rack gears extending in the front-rear direction are respectively attached to the lower surfaces of the joists 37, and a pair of left and right pinions configured to respectively mesh with the rack gears are respectively attached to left and right end portions of an upper surface of the base 47. The base 47 is formed to be hollow, and a slot actuator 96 (see FIG. 11), such as a servo motor, configured to drive the translation mechanism 46 is accommodated in the base 47. When the slot actuator 96 operates, the translation mechanism 46 is driven, so that the base 47 of the rack robot 13 moves in the front-rear direction at the lower surface sides of the pair of joists 37.

A roller beam 48 is attached to a front surface side of the base 47 so as to be movable in the upper-lower direction. The roller beam 48 includes a base portion 49 extending in the left-right direction, and a pair of left and right coupling portions 50 respectively extend from left and right end portions of the base portion 49. A pair of left and right housings 52 respectively extend in the lower direction from left and right end portions of the base 47. The coupling portions 50 are provided so as to respectively overlap the housings 52 in the front-rear direction. Each of the housings 52 accommodates a ball screw mechanism 53 and a lift actuator 97 (see FIG. 11), such as a servo motor. The ball screw mechanism 53 includes a ball screw extending in the upper-lower direction and a nut threadedly engaged with the ball screw, and the lift actuator 97 is configured to cause the ball screw to rotate. The coupling portion 50 is coupled to the nut of the ball screw mechanism 53. When the lift actuator 97 operates, the ball screw is rotated, so that the nut moves in the upper-lower direction. With this, the roller beam 48 including the coupling portions 50 moves in the upper-lower direction.

The roller beam 48 includes a plurality of projections 51 arranged at intervals in the left-right direction. Rollers 54 each configured to rotate about an axis extending in the front-rear direction are provided on front surfaces of the projections 51. A groove 54a (see FIGS. 14A to 14D) is formed on an axially middle portion of each roller 54 so as to extend along the entire periphery in the circumferential direction. The projections 51 are formed to be hollow, and roller actuators 98 (see FIG. 11) configured to drive the rollers 54 are accommodated in the projections 51. When the roller actuators 98 operate, the rollers 54 are rotated in the same direction at the same speed.

A left side of FIG. 4 shows a state where the roller beam 48 has moved to a lower limit of a movement range to be located at an evacuation position, and a right side of FIG. 4 shows a state where the roller beam 48 at the evacuation position has moved in the upper direction to be located at a carry-in position. An upper limit of the movement range of the roller beam 48 is higher than the carry-in position shown in the right side of FIG. 4, and the roller beam 48 can move to a posture changing position (see FIG. 14B) located higher than the carry-in position.

The projections 51 project in the upper direction from the base portion 49. Each of the projections 51 is arranged between the joist 37 and vertical girder 39 of the bed portion 35 or between two adjacent vertical girders 39. Therefore, when the roller beam 48 is located at the carry-in position, the projections 51 and the rollers 54 project above the bed portion 35 without interfering with the bed portion 35. When the roller beam 48 is located at the carry-in position, the rollers 54 attached to the roller beam 48 are located at the same position as the rollers 30 of the track robot 11 in the upper-lower direction. Therefore, when the glass plate 2 is carried in from the track robot 11, the lower end portion thereof is mounted on and supported by the rollers 54 without rattling in the upper-lower direction. When the rollers 54 are rotated, the glass plate 2 on the rollers 54 slides.

When the roller beam 48 is located at the evacuation position, the projections 51 and the rollers 54 are located lower than the lower surfaces of the cross girders 38. Therefore, the rack robot 13 can be moved in the front-rear direction while preventing the projections 51 and the rollers 54 from colliding with the bed portion 35 and the rack main body 32. Even when the roller beam 48 is located at the evacuation position, the rack robot 13 is suspended from the base 31, so that a maintenance operation of the floor surface can be easily performed.

(Supporting Portion)

Figure 5:
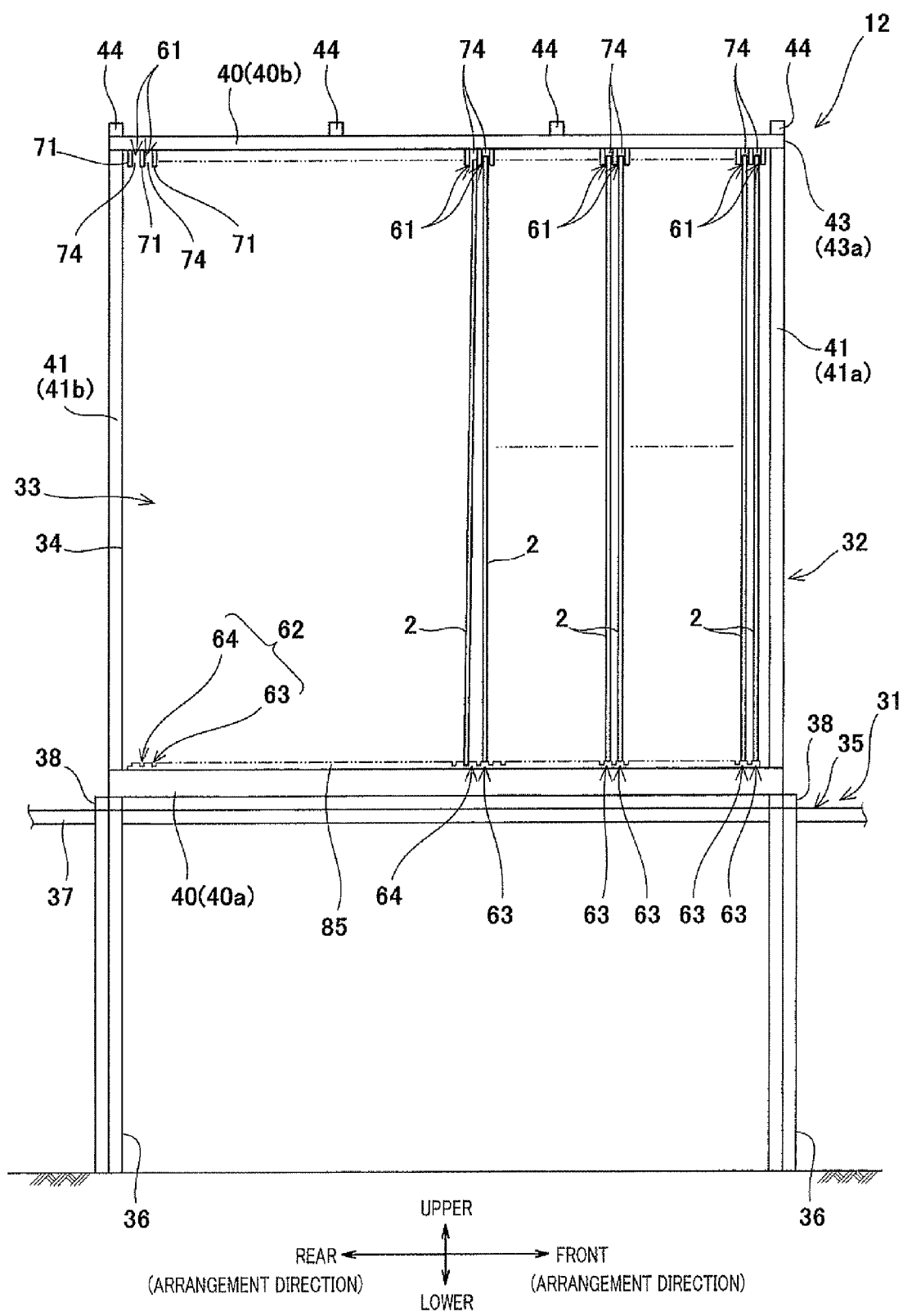
FIG. 5 is a side view showing a part of the left-side rack shown in FIG. 2 when viewed from a carry-in direction.

FIG. 5 is a side view showing the rack 12 when viewed from the carry-in direction. As shown in FIG. 5, the rack 12 includes a plurality of upper supporting portions 61 configured to respectively support the upper edge portions of the standing glass plates 2 and support storage portions 62 configured to respectively support or store the lower edge portions of the standing glass plates 2. Each of the support storage portions 62 of the present embodiment includes the lower supporting portion 63 and the lower edge portion storage portion 64. The lower supporting portion 63 is provided under the upper supporting portion 61. The lower edge portion storage portion 64 is provided at an outer side (rear side in the present embodiment) of an end of the upper supporting portion 61 and an end of the lower supporting portion 63 in the arrangement direction of the glass plate 2 and stores the lower edge portion of the glass plate 2 carried in the storage space 33 through the carry-in opening 34. The upper supporting portions 61 and the lower supporting portions 63 are formed in accordance with the number of glass plates 2 to be stored in the storage space 33. In the present embodiment, the lower edge portion storage portions 64 are also formed in accordance with the maximum number of glass plates 2 the storage space 33 can store.

Figure 6:
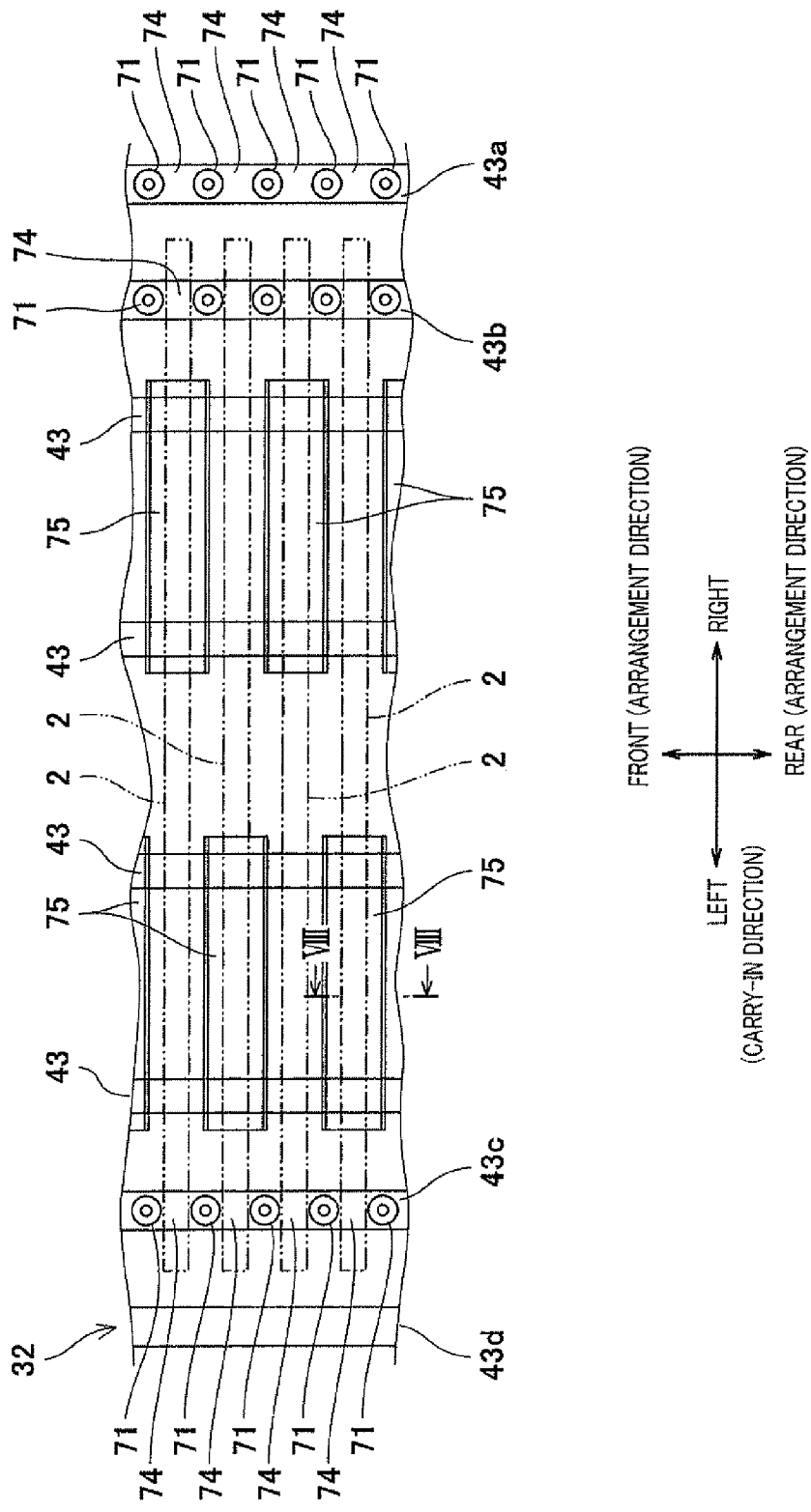
FIG. 6 is a plan view showing a part of the rack shown in FIG. 5.
Figure 7:
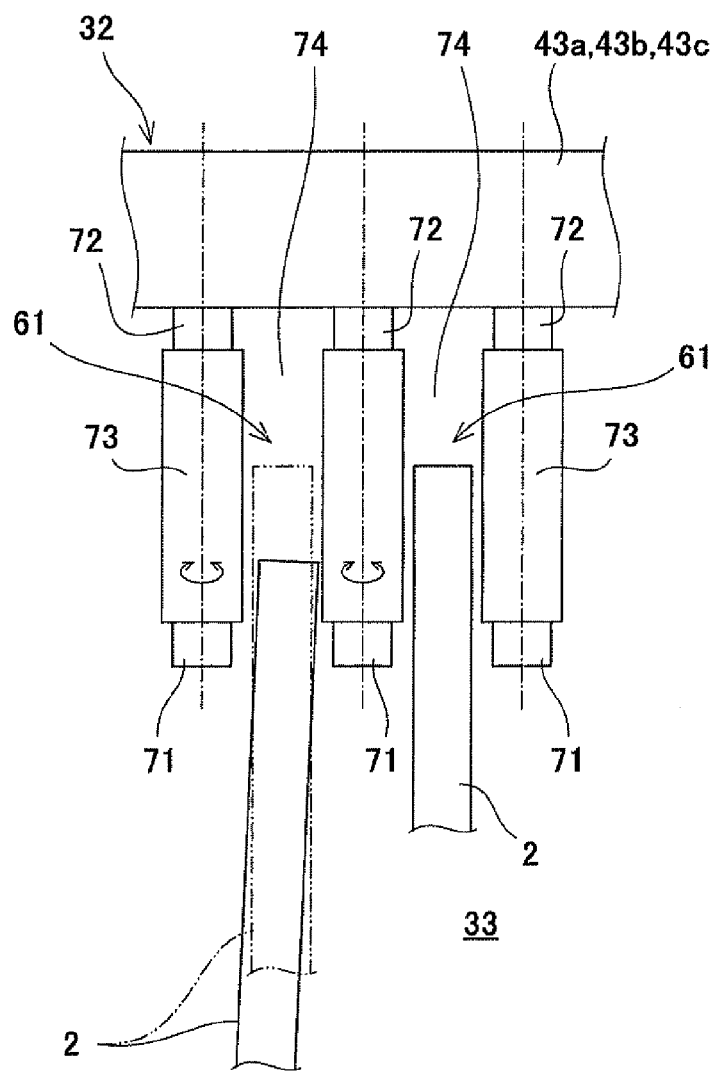
FIG. 7 is a partially enlarged view of FIG. 5.
Figure 7:
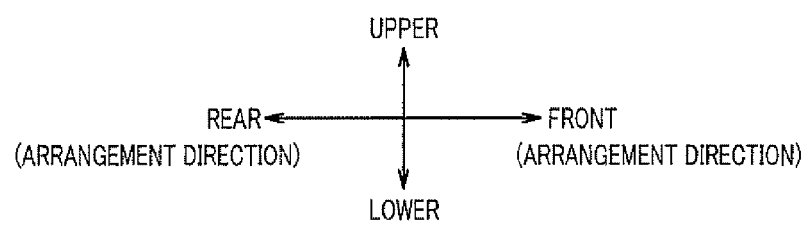

FIG. 6 is a partial plan view of the rack 12, and FIG. 7 is a partially enlarged view of FIG. 5. As shown in FIGS. 6 and 7, the plurality of upper supporting portions 61 are constituted by a plurality of support rollers 71 provided on a lower surface(s) of one or more upper vertical girders 43. In the present embodiment, the support rollers 71 are provided on three upper vertical girders that are the upper vertical girder 43a defining the carry-in opening 34, an upper vertical girder 43b adjacent to the upper vertical girder 43a, and an upper vertical girder 43c adjacent to an upper vertical girder located at an end edge opposite to the carry-in opening 34. On each of the upper vertical girders 43a, 43b, and 43c, the support rollers 71, the number of which is larger by one than the number of glass plates 2 to be stored, are arranged in a line at regular intervals in the front-rear direction.

Each of the support rollers 71 includes a shaft 72 extending in the lower direction from the lower surface of the upper vertical girder 43 and a cylindrical rotating member 73 provided on an outer periphery side of the shaft 72. Clearances 74 are each formed between two rotating members 73 adjacent to each other in the front-rear direction. Each of the clearances 74 has a front-rear-direction size slightly larger than the thickness of the glass plate 2. When the upper edge portion of the standing glass plate 2 is received in the clearance 74, the upper edge portion of the glass plate 2 is sandwiched between and supported by outer peripheral surfaces of a pair of rotating members 73 defining this clearance 74. One clearance 74 can receive one glass plate 2, and the rack main body 32 can store the glass plates 2, the number of which is equal to the number of clearances 74 formed so as to be arranged in the front-rear direction (arrangement direction) when viewed from the left-right direction (carry-in direction). In the present embodiment, each clearance 74 and each group including two adjacent rotating members (support rollers) defining the clearance 74 serve as one upper supporting portion 61.

Figure 8:
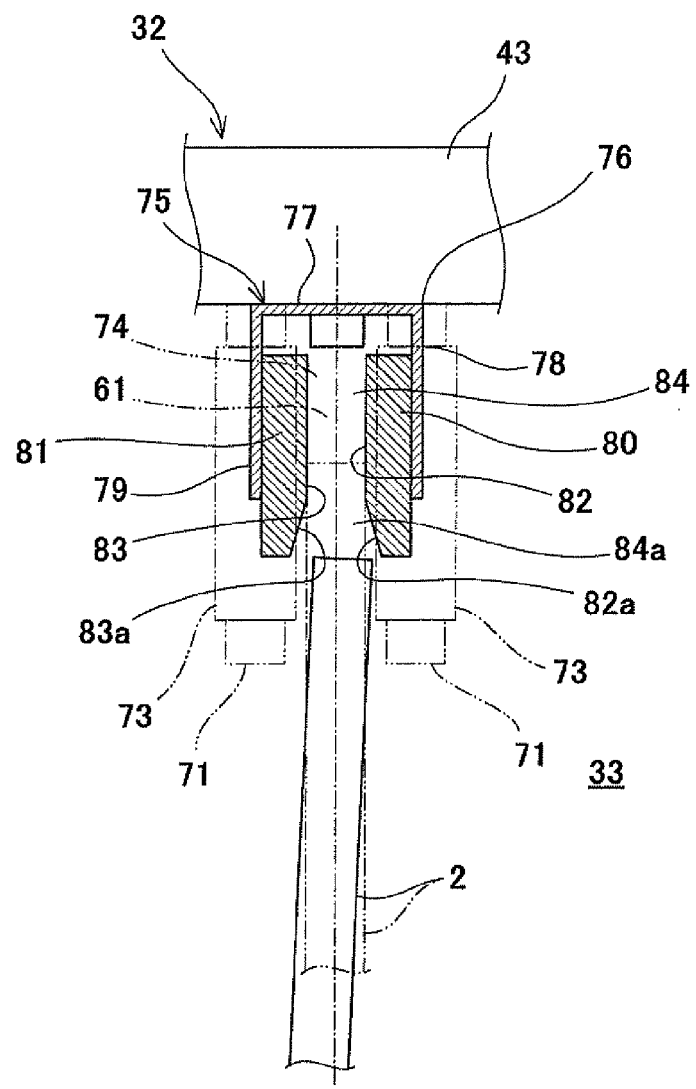
FIG. 8 is a cross-sectional view taken along line VIII-VIII of FIG. 6 and shows a rack main body.
Figure 8:
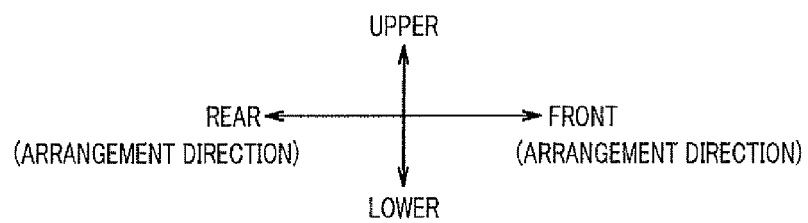

FIG. 8 is a cross-sectional view taken along line VIII-VIII of FIG. 6 and shows the rack main body 32. As shown in FIG. 8, restraining members 75 each configured to restrain the upper edge portion of the glass plate 2 are fixed to the lower surfaces of the upper vertical girders 43. The restraining member 75 of the present embodiment includes a bracket 76 extending in the left-right direction and having a U-shaped cross section. The bracket 76 includes a base wall 77 joined to the lower surface of the upper vertical girder 43 and a pair of side walls 78 and 79 respectively extending in the lower direction from front and rear edge portions of the base wall 77. Restraining pieces 80 and 81 are respectively joined to inner surfaces of the side walls 78 and 79. Each of the restraining pieces 80 and 81 is formed to have a band shape and extends in the left-right direction. The restraining pieces 80 and 81 respectively include opposed surfaces 82 and 83 opposed to each other. A restraining groove 84 extending in the left-right direction is formed between the opposed surfaces 82 and 83. The restraining member 75 is provided such that a front-rear-direction center line of the restraining groove 84 coincides with a front-rear-direction center line of the clearance 74.

Lower end portions 80*a* and 81*a* of the restraining pieces 80 and 81 respectively project from lower ends of the side walls 78 and 79 in the lower direction. Tapered surfaces 82*a* and 83*a* are respectively formed at lower end portions of the opposed surfaces 82 and 83 so as to be inclined away from each other. At a portion where the tapered surfaces 82*a* and 83*a* are not formed, a front-rear-direction size of the restraining groove 84 is substantially the same as the thickness of the glass plate 2 and slightly smaller than the clearance 74. Since a lower end portion 84*a* of the restraining groove 84 is defined by the tapered surfaces 82*a* and 83*a*, a front-rear-direction size of the lower end portion 84*a* increases toward the lower direction. A front-rear-direction size of a lower end of the restraining groove 84 is larger than the front-rear-direction size of the clearance 74.

As shown in FIG. 6, the restraining member 75 is provided on lower surface sides of at least two adjacent upper vertical girders 43 in the left-right direction. Then, a plurality of restraining members 75 are arranged in two lines in the front-rear direction in a staggered manner. Therefore, even if a front-rear-direction outer size of the restraining member 75 is larger than that of the support roller 71, both providing the restraining members 75 such that at least one restraining member 75 corresponds to one glass plate 2 and avoiding the increase in size of the rack main body 32 in the front-rear direction can be realized by the above staggered arrangement.

Figure 9:
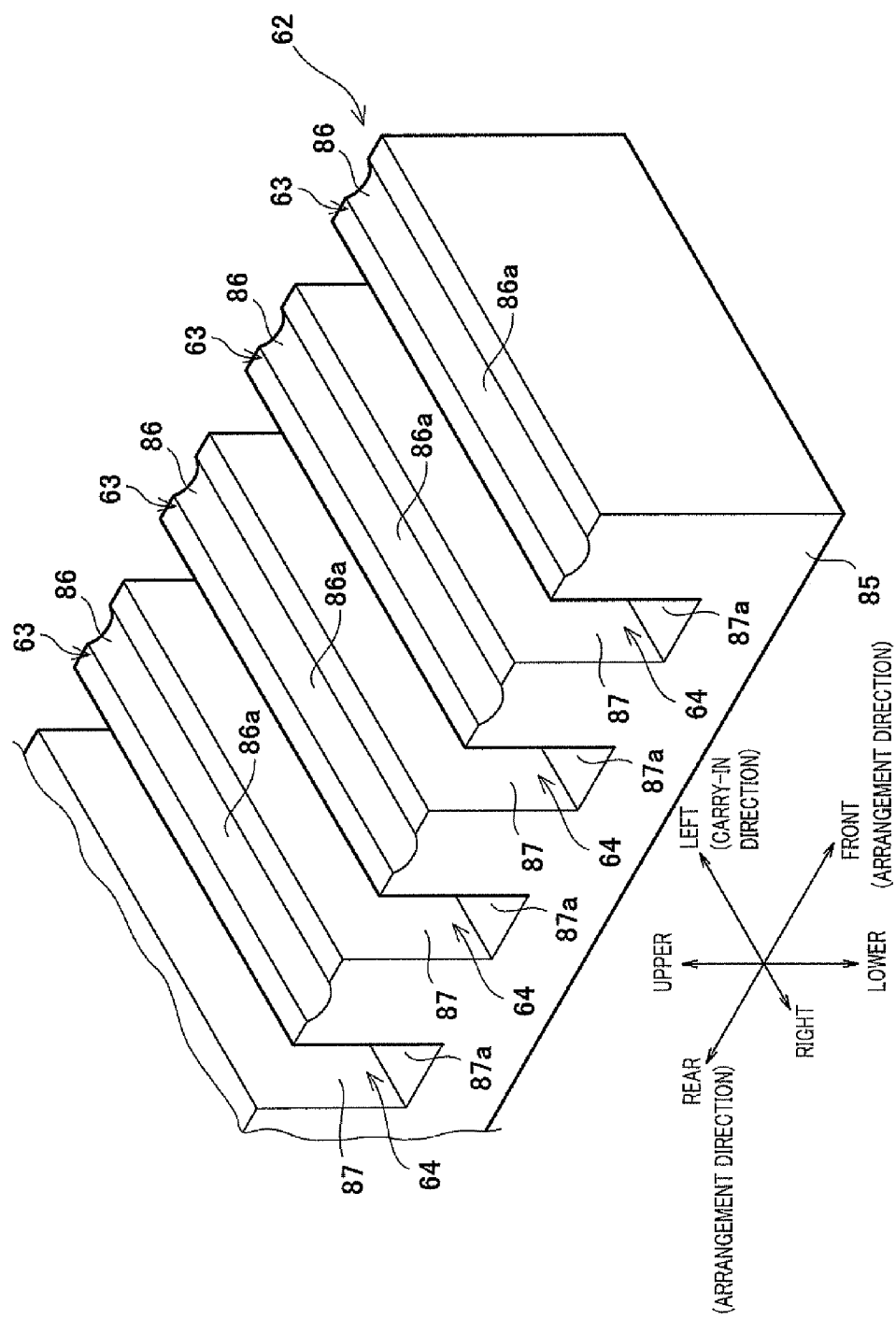
FIG. 9 is a perspective view of lower supporting portions.
Figure 10:
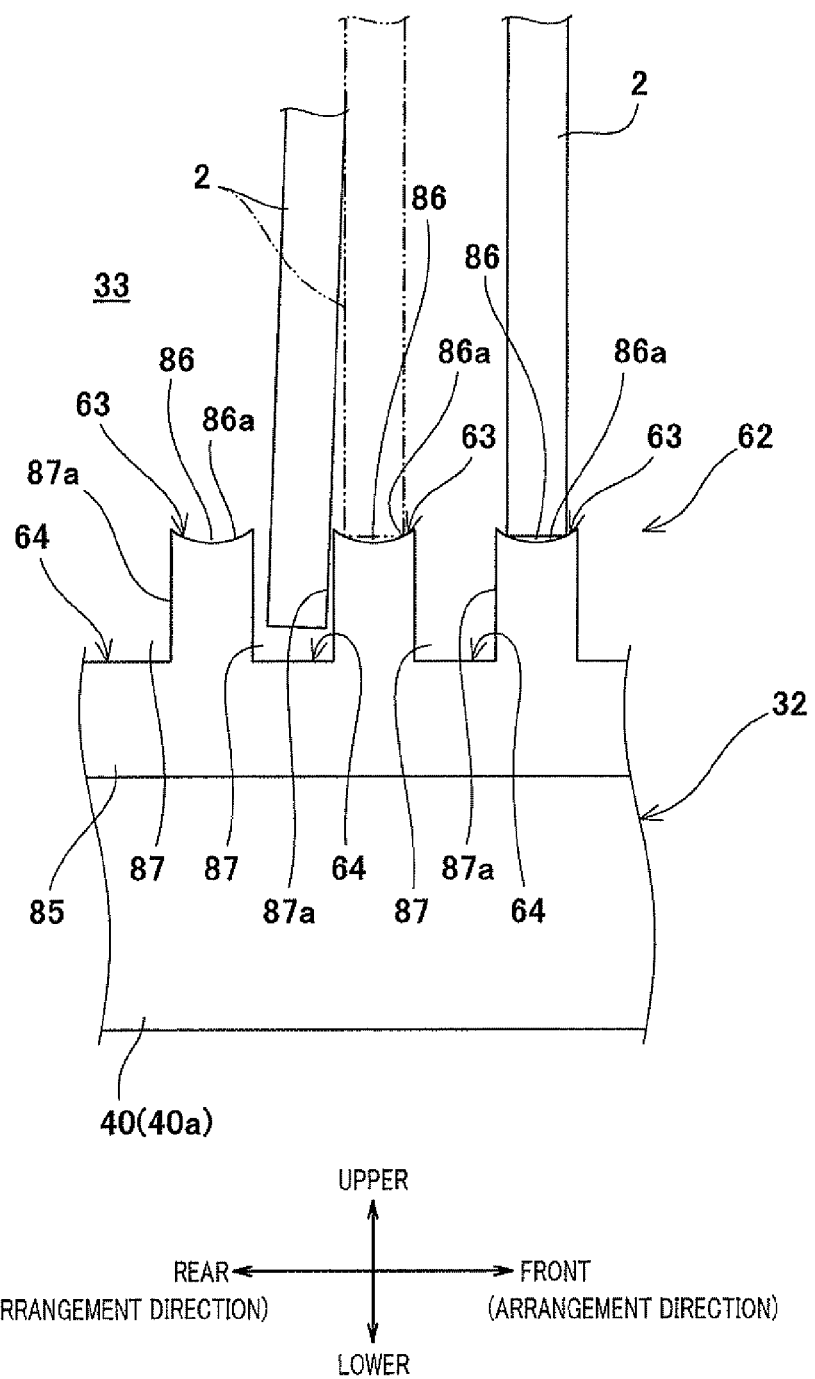
FIG. 10 is a partially enlarged view of FIG. 5.

FIG. 9 is a perspective view of the support storage portion 62, and FIG. 10 is a partially enlarged view of FIG. 5. As shown in FIGS. 9 and 10, the support storage portion 62 is constituted by a pad 85 fixed to the upper surface of the bottom vertical girder 40, and the lower end portion of the standing glass plate 2 is supported on the pad 85. It is preferable that the pad 85 be produced from a material, such as PEEK resin, silicon rubber, or Teflon (trademark), having high friction coefficient and heat resistance. When the glass plate 2 is supported on the pad 85, the frictional force is generated by the weight of the heavy-weight glass plate 2 itself. By using a material which can increase this frictional force, the pad 85 can stably hold the glass plate 2. In addition, even if the rack main body 32 is conveyed to the processing device 4, and the glass plates 2 are subjected to the heat treatment, the pad 85 does not deteriorate.

The lower supporting portions 63 and the lower edge portion storage portions 64 located lower than the lower supporting portions 63 are provided on the pad 85 so as to be arranged alternately in the front-rear direction. The lower supporting portions 63 respectively include first grooves 86 configured to be concave in the lower direction and extend in the left-right direction. A front-rear-direction center surface of the first groove 86 coincides with a front-rear-direction center surface of the clearance 74 formed by the support rollers 71. The lower edge portion storage portions 64 respectively include second grooves 87 configured to be concave in the lower direction and extend in the left-right direction. A surface defining the first groove 86 forms a first bottom surface 86*a* capable of supporting the lower edge portion of the glass plate 2, and a surface defining the second grooves 87 forms a second bottom surface 87*a* capable of supporting the lower edge portion of the glass plate 2. The second bottom surface 87*a* is located lower than the first bottom surface 86*a*.

[Control System]

Figure 11:
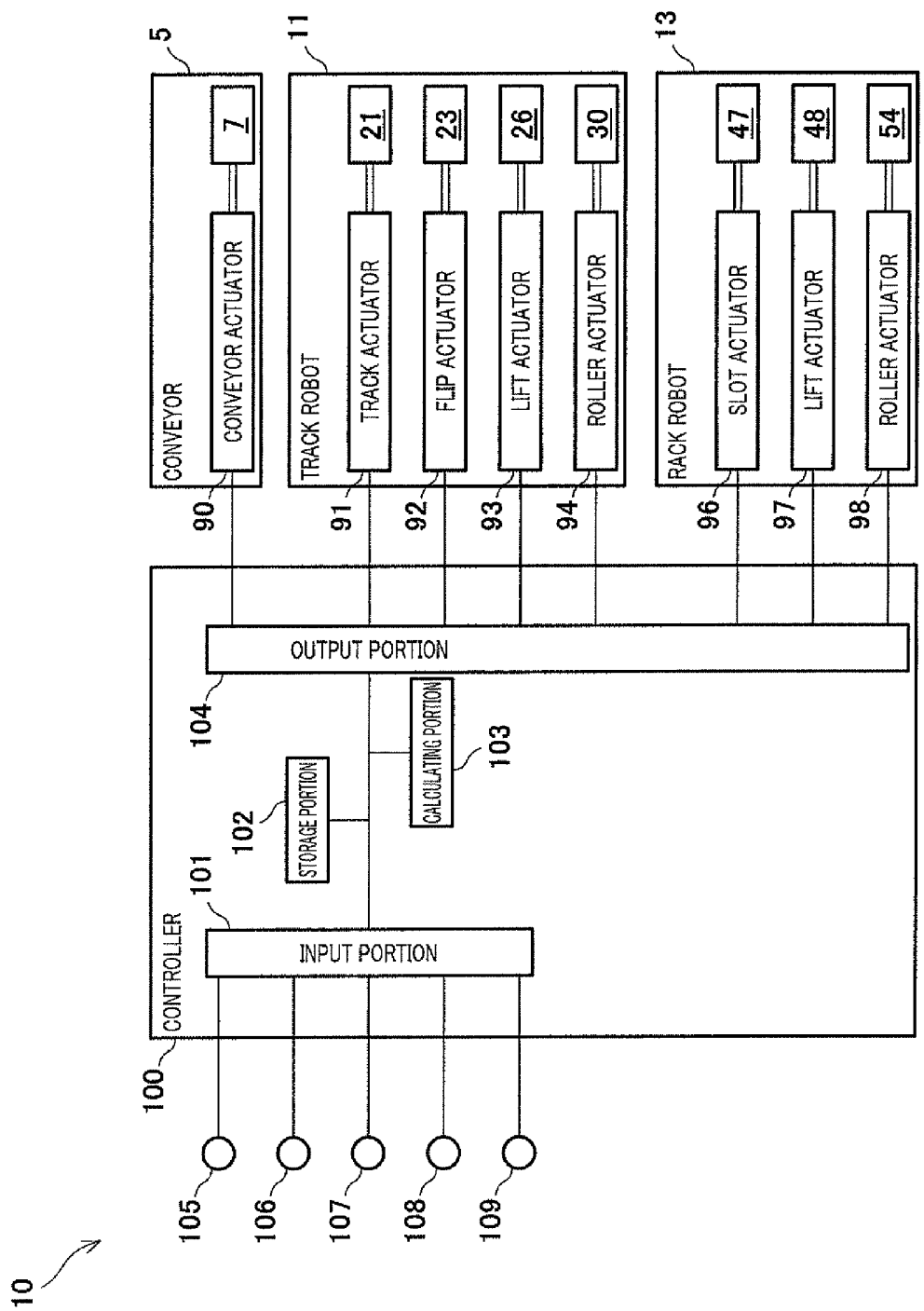
FIG. 11 is a configuration diagram showing the configuration of a control system of the transfer facility.

As shown in FIG. 11, the transfer facility 10 includes a controller 100 configured to control the conveyor 5, the track robot 11, and the rack robot 13. The controller 100 is constituted by, for example, a microcomputer and includes an input portion 101 constituted by an I/O, a storage portion 102 constituted by an internal memory, a calculating portion 103 constituted by a CPU, and an output portion 104 constituted by the 110.

The input portion 101 receives detection signals from a glass plate sensor 105, a glass map sensor 106, a slot calibration sensor 107, a robot alignment sensor 108, and glass roll-in sensors 109. The glass plate sensor 105 is provided at the track robot 11 and detects whether or not the glass plate 2 exists at the end-effector 23 of the track robot 11. The glass map sensor 106 is provided at the rack robot 13 and detects a region, not being occupied by the glass plate 2, in the storage space 33 while the rack robot 13 is moving in the front-rear direction. The slot calibration sensor 107 is provided at the rack robot 13. While the rack robot 13 is moving in the front-rear direction, the slot calibration sensor 107 detects a front-rear-direction position at which the rack robot 13 should stop in order to be able to properly carry the glass plate 2 in the storage space 33. The robot alignment sensor 108 is provided at the track robot 11 and/or the rack robot 13 and detects whether or not the rollers 30 of the track robot 11 are aligned with the rollers 54 of the rack robot 13 in the left-right direction. The glass roll-in sensors 109 are respectively provided at the track robot 11 and the rack robot 13 and detect the position of the glass plate 2 sliding on the rollers 30 and 54 aligned in the left-right direction. As each of these sensors 105 to 109, an optical transmission sensor, an optical reflection sensor, an ultrasonic distance sensor, or the like may be used.

The storage portion 102 stores programs for controlling the conveyor 5, the track robot 11, and the rack robot 13. The calculating portion 103 executes the programs, stored in the storage portion 102, to process the signals input to the input portion 101. Then, the calculating portion 103 controls the operations of the actuators via the output portion 104.

The actuators connected to the output portion 104 include: a conveyor actuator 90 configured to drive the wheel axles 7 of the conveyor 5; the track actuator 91, flip actuator 92, lift actuator 93, and roller actuator 94 of the track robot 11 described as above; and the slot actuator 96, lift actuator 97, and roller actuator 98 of the rack robot 13 as described above. The operations and stops of the respective actuators explained below are controlled by the controller 100.

[Storing Method]

Figure 12:
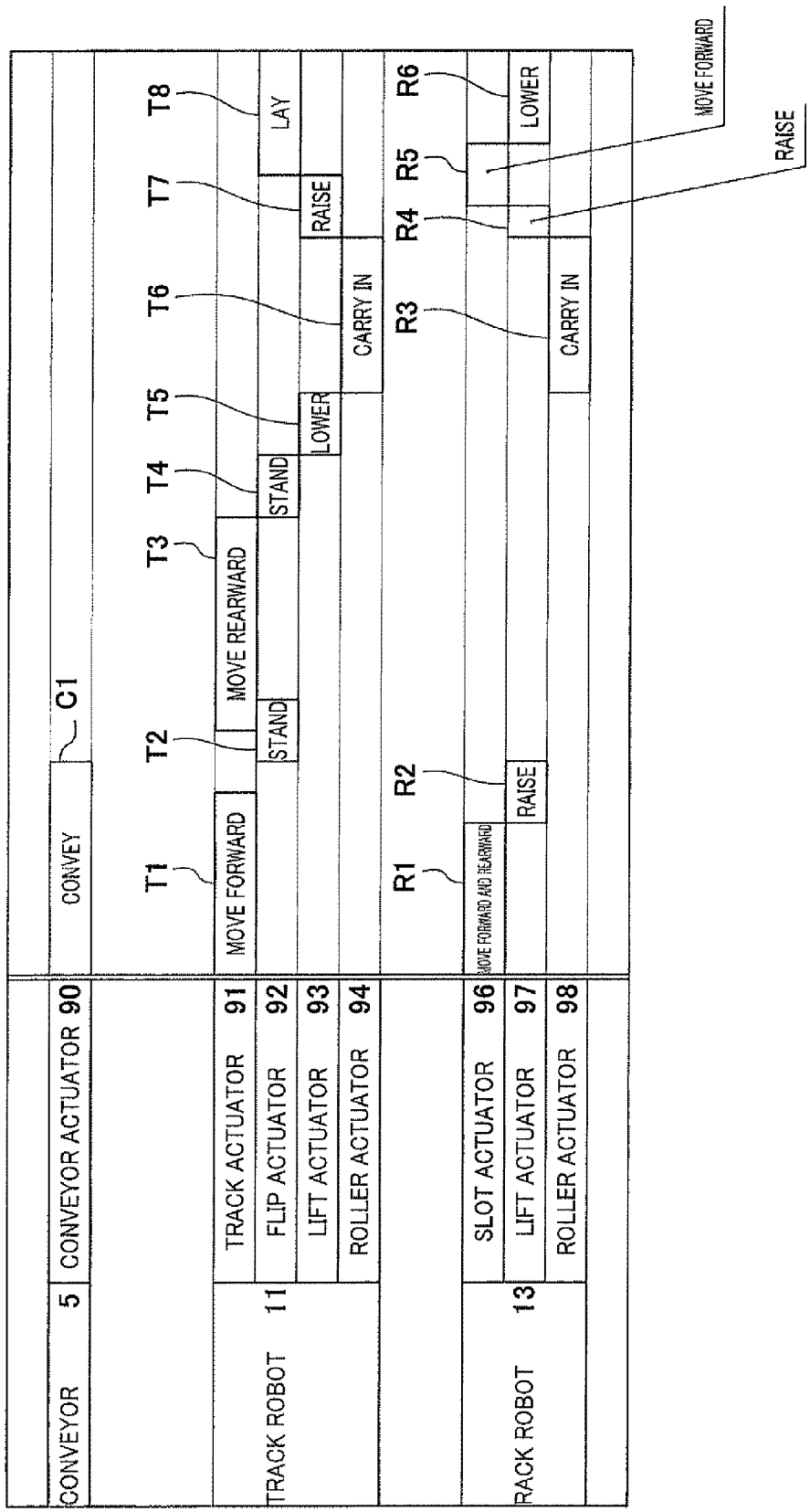
FIG. 12 is a timing diagram showing operation timings of respective actuators when storing a glass plate in the rack.

FIG. 12 is a timing diagram showing one example of operation timings of the respective actuators of the conveyor 5, the track robot 11, and the rack robot 13 when storing one glass plate 2 in the rack 12. By repeatedly performing the operations shown in FIG. 12, the glass plates 2 can be sequentially stored in the rack 12 one by one.

(Preparation for Receiving Glass Plate)

When storing the glass plate 2 in the rack 12, the conveyor actuator 90 of the conveyor 5 is activated to convey to the stop position the glass plate 2 horizontally laid on the wheel axles 7 (see a reference sign C1 in FIG. 12 and also see FIG. 1). When the glass plate 2 contacts the stoppers 8 and reaches the stop position, the conveyor actuator 90 is stopped. With this, the conveyor 5 is ready to pass the glass plate 2 to the track robot 11.

At the same time as the above operations, the track actuator 91 of the track robot 11 is activated to cause the base 21 to move in the front direction (see a reference sign T1 in FIG. 12 and also see a chain double-dashed line in FIG. 1). When causing the base 21 to move in the the front direction, the lift bar 26 is raised in advance, and the end-effector 23 is caused to be located at a horizontal position at which the postures of the fangs 25 horizontally extend toward the front direction (see reference signs T7 and T8 in FIG. 12). In this state, when the base 21 is moved in the front direction, the fangs 25 are inserted in spaces located under the glass plate 2 located at the stop position and also located among the plurality of wheel axles 7 supporting the glass plate 2. Then, the base 21 is moved to a front end position of a movement range to be stopped thereat. With this, the track robot 11 is ready to receive the glass plate 2.

(Determination of Storage Place)

When storing the glass plate 2 in the rack 12, the storage position of the glass plate 2 in the storage space 33 is determined. More specifically, the upper supporting portion 61 by which the upper edge portion of the glass plate 2 is supported and the support storage portion 62 by which the lower edge portion of the glass plate 2 is supported are determined. At this time, the slot actuator 96 of the rack robot 13 is activated to cause the rack robot 13 to move in the front-rear direction (see a reference sign R1 in FIG. 12). When the rack robot 13 is moved in the front-rear direction, the roller beam 48 is lowered to be located at the evacuation position in advance (see a reference sign R6 in FIG. 12 and also see a left side in FIG. 4). Therefore, the roller beam 48 and the rollers 54 do not interfere with the rack 12 and the glass plate 2 stored in the rack 12.

While the rack robot 13 is being moved in the front-rear direction, the controller 100 refers to the detection signal supplied from the glass map sensor 106 to detect a space region, not being occupied by the glass plate 2, in the storage space 33. When the space region is detected, the controller 100 refers to the detection signal supplied from the slot calibration sensor 107 to precisely detect the storage position of the glass plate 2 around the space region, to be specific, the position of the empty clearance 74. When this position is detected, the slot actuator 96 is stopped to stop the movement of the rack robot 13.

Next, the lift actuator 97 of the rack robot 13 is activated to raise the roller beam 48 of the rack robot 13 to the carry-in position (see a reference sign R2 in FIG. 12). With this, the rack robot 13 is ready to carry the glass plate 2 in the storage space 33. The operations of the rack robot 13 are executed at the same time as the above-described operations of the conveyor 5 and the track robot 11.

(Reception of Glass Plate and Conveyance of Glass Plate to Storage Position)

When the conveyor 5 and the track robot 11 are ready to respectively pass the glass plate 2 and receive the glass plate 2, and the movement of the rack robot 13 in the front-rear direction is completed, the flip actuator 92 of the track robot 11 is activated to cause the end-effector 23 to swing such that the fangs 25 gradually stand (see a reference sign T2 in FIG. 12). As this swinging operation continues, a flat surface of the glass plate 2 is supported by the surfaces of the rollers 28, and an edge portion, facing the track robot 11, of the glass plate 2 is supported by the supporting blocks 27. Then, while maintaining this state, the glass plate 2 is separated from the conveyor 5 to gradually stand together with the fangs 25. With this, the glass plate 2 is transferred from the conveyor 5 to the end-effector 23 of the track robot 11.

Then, the flip actuator 92 is stopped once to stop the swinging operation of the end-effector 23, so that the end-effector 23 is stopped at a predetermined conveyance position (see FIG. 2). In a case where an angular position of the end-effector 23 located at the horizontal position is 0°, and an angular position of the end-effector 23 when the fangs 25 completely stand is 90°, an angular position of the end-effector 23 located at the conveyance position is in a range from 30° to 50°.

In the middle of the process of causing the fangs 25 to swing from the horizontal position to the conveyance position, the track actuator 91 is activated to cause the base 21 to move in the rear direction (see a reference sign T3 in FIG. 12). As above, by causing the base 21 to move during the swinging operation, the tact time may be reduced. In addition, an inertial force toward the front direction acts on the glass plate 2, so that the glass plate 2 is pressed against the fangs 25 and the supporting blocks 27. Thus, the end-effector 23 can stably hold the glass plate 2.

While the base 21 is being moved in the rear direction, the controller 100 refers to the robot alignment sensor 108. Then, when the rollers 30 of the track robot 11 are aligned with the rollers 54 of the rack robot 13 in the left-right direction based on the signal input from the robot alignment sensor 108, the track actuator 91 of the track robot 11 is stopped to stop the movement of the base 21 in the rear direction.

Figure 13:
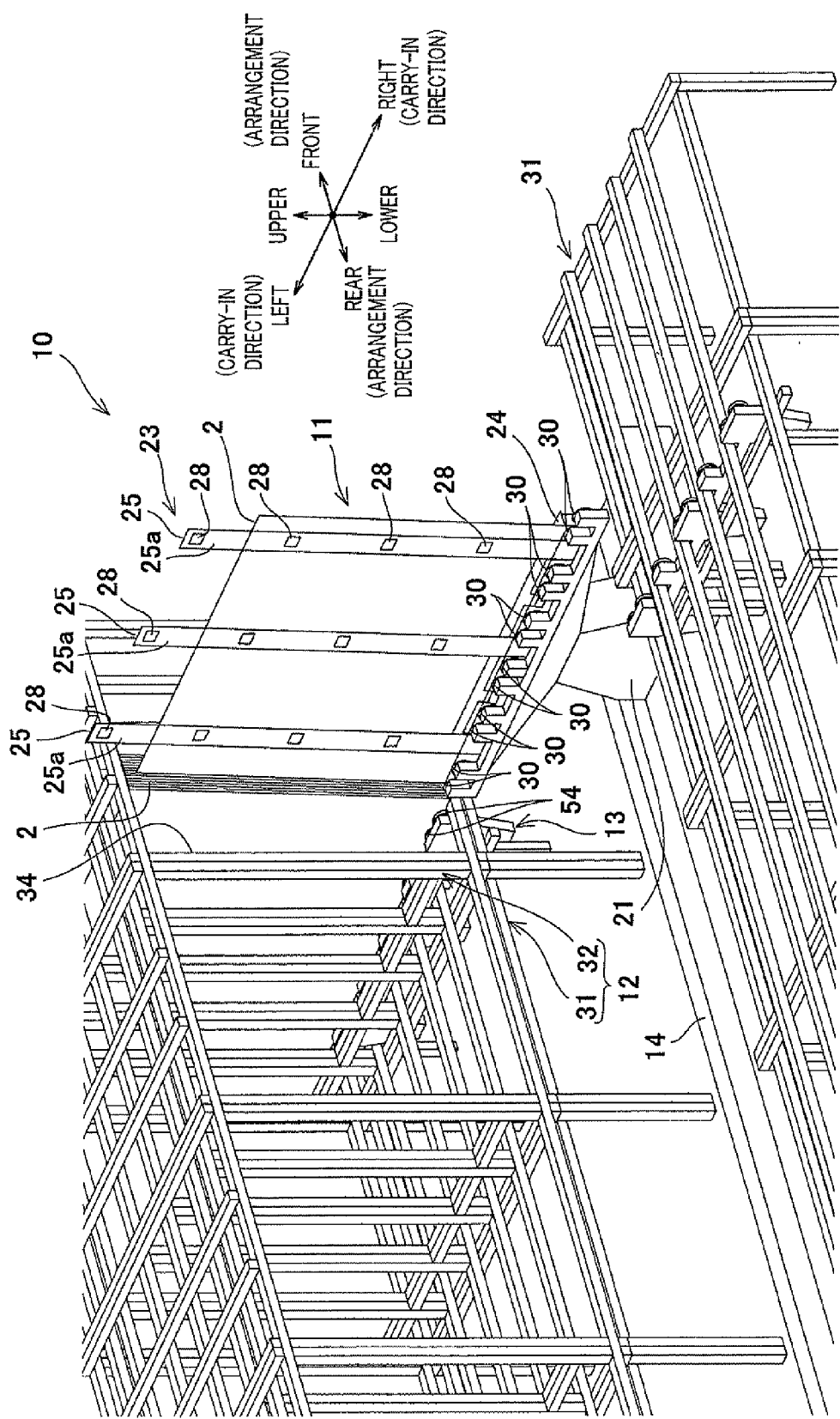
FIG. 13 is a perspective view showing a state where it is ready to carry the glass plate in the rack.

When the movement of the base 21 is terminated, the flip actuator 92 is activated to restart the swinging operation of the end-effector 23 such that the fangs 25 gradually stand (see a reference sign 14 in FIG. 12 and also see FIG. 13). Then, the flip actuator 92 is stopped to stop the end-effector 23 at the carry-in position. An angular position of the end-effector 23 located at the carry-in position is in a range from 75° to 85°. At this time, the lower edge portion of the glass plate 2 is supported on the supporting blocks 27. The posture of the glass plate 2 does not become a completely upright posture, but the glass plate 2 stands so as to be slightly inclined toward the horizontal position from the upright posture. In a case where the glass plate 2 is inclined, a moment which causes the glass plate 2 to rotate in the front direction by using as a fulcrum the lower edge portion supported by the rollers 30 acts on the glass plate 2 by the weight of the glass plate 2 itself. The surface, facing toward the front direction, of the glass plate 2 contacts the surfaces of the rollers 28, and the rotation moment is supported by the end-effector 23.

When the swinging operation of the end-effector 23 is terminated as above, the lift actuator 93 is activated to lower the lift bar 26 (see a reference sign T5 in FIG. 12 and also see FIG. 13). At this time, while maintaining a state where the lower edge portion of the glass plate 2 is supported by the supporting blocks 27, and the surface facing toward the front direction is supported by the surfaces of the rollers 28, the glass plate 2 is lowered together with the lift bar 26 along the surfaces 25a of the fangs 25. Since the rollers 28 rotate when the glass plate 2 is lowered, the glass plate 2 can be stably lowered while supporting the surface, facing toward the front direction, of the glass plate 2 by the end-effector 23, and the surface facing toward the front direction can be prevented from being scraped.

When the lift bar 26 is moved to the lower limit of the movement range, the lift actuator 93 is stopped to stop the lift bar 26. In the process of the lowering operation, the lower edge portion of the glass plate 2 is received in the grooves of the rollers 30 and supported by peripheral surfaces defining these grooves (see FIG. 13). With this, the track robot 11 is ready to carry the glass plate 2 in the storage space 33.

(Carrying of Glass Plate in Storage Space)

When both the track robot 11 and the rack robot 13 are ready to carry the glass plate 2 in, the roller actuator 94 of the track robot 11 and the roller actuator 98 of the rack robot 13 are activated to cause the rollers 30 of the track robot 11 and the rollers 54 of the rack robot 13 to rotate in the same direction at the same speed at the same time (see reference signs T6 and R3 in FIG. 12).

With this, the glass plate 2 slides by the rotation of the rollers 30 of the track robot 11 in the carry-in direction toward the carry-in opening 34 of the rack main body 32 in which the glass plate 2 is to be stored. Even at this time, the surface, facing toward the front direction, of the glass plate 2 is being supported by the surfaces of the rollers 28. Therefore, the glass plate 2 can be caused to stably slide while supporting this surface of the glass plate 2 by the end-effector 23, and this surface of the glass plate 2 can be prevented from being scraped.

The upper vertical girder 43a defining the carry-in opening 34 is provided with the support rollers 71, and the bottom vertical girder 40a defining the carry-in opening 34 is provided with the pad 85 (see FIG. 5). Therefore, when the glass plate 2 reaches the carry-in opening 34, the upper edge portion of the glass plate 2 is immediately inserted in the empty clearance 74. In addition, the lower edge portion of the glass plate 2 is immediately inserted in the second groove 87 of the lower edge portion storage portion 64 adjacently located in front of the lower supporting portion 63 located immediately under the above empty clearance 74. Since the upper edge portion and lower edge portion of the glass plate 2 are immediately supported as above, the glass plates 2 can be stably carried in the storage space 33. In addition, the second groove 87 is located at an arrangement-direction outer side of the first groove 86 located immediately under the clearance 74, that is, located at the rear side of the first groove 86 located immediately under the clearance 74 in the present embodiment. Therefore, in a state where the lower edge portion is received in the second grooves 87, and the upper edge portion is received in the clearance 74, the glass plate 2 stands so as to be slightly inclined toward the front direction from the completely upright posture. Therefore, the posture of the glass plate 2 does not change significantly when the glass plate 2 reaches the carry-in opening 34, and the glass plate 2 smoothly passes through the carry-in opening 34.

Figure 14A:
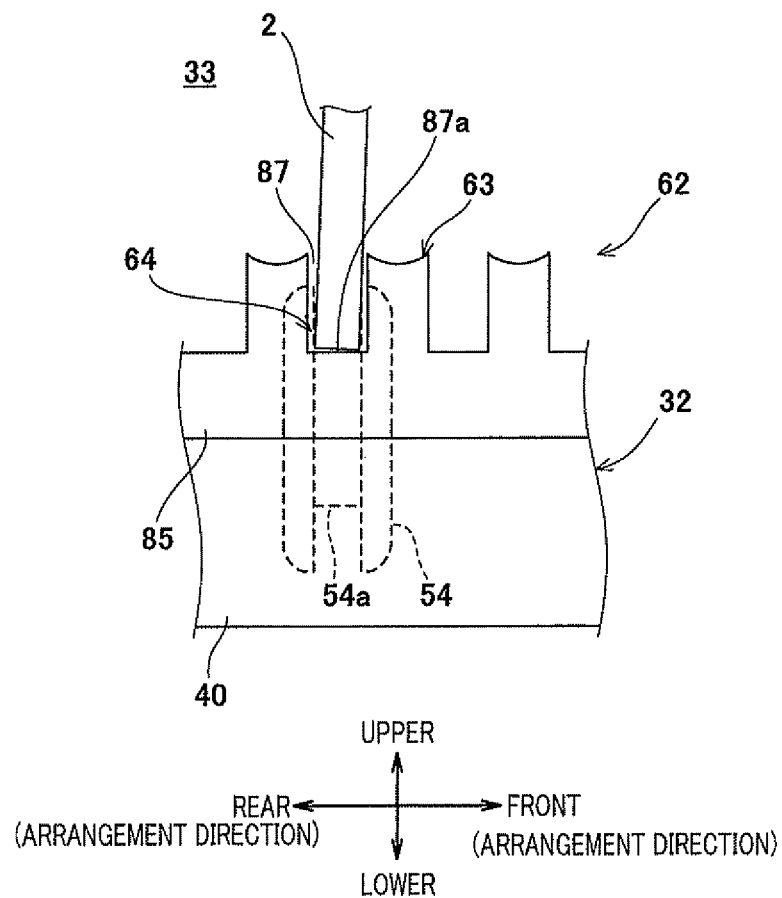
FIG. 14A is an action diagram showing the movement of a lower edge portion of the glass plate when changing the posture of the glass plate in the storage space and is the action diagram showing a state immediately after the operation of carrying the glass plate in the rack is completed.

Then, the second bottom surface 87a of the lower edge portion storage portion 64 is located slightly lower in the upper-lower direction than a peripheral surface defining the groove 54a of the roller 54 (see FIG. 14A). Therefore, the lower edge portion of the glass plate 2 having been introduced in the second grooves 87 and gotten out of the second groove 87 is received in the groove 54a of the roller 54 located close to the carry-in opening 34 among the rollers 54 of the rack robot 13 without rattling in the upper-lower direction. The lower edge portion of the glass plate 2 alternately passes through the second grooves 87 provided on the bottom vertical girders 40 and the grooves 54a of the rollers 54 each provided between the bottom vertical girders 40 to be gradually stored in the lower edge portion storage portion 64. As above, the roller 54 of the rack robot 13 constitutes a supporting body configured to support the lower edge portion of the plate-shaped member.

Figure 15A:
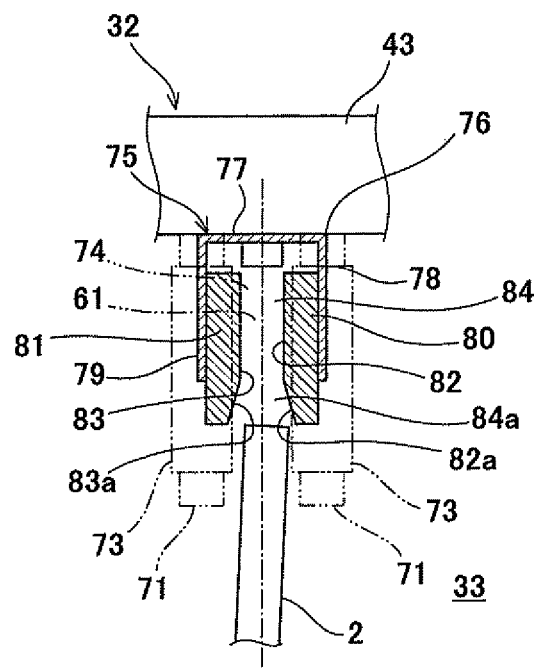
FIG. 15A is an action diagram showing the movement of an upper edge portion of the glass plate when changing the posture of the glass plate in the storage space and is the diagram showing a state immediately after the operation of carrying the glass plate in the rack is completed.

The restraining groove 84 is arranged at the same position as the clearance 74 in the arrangement direction when viewed from the left-right direction, but the upper edge portion of the glass plate 2 is located lower than the lower end of the restraining groove 84 (see FIGS. 8 and 15A). In a state where the glass plate 2 is stored in the lower edge portion storage portion 64 located lower than the lower supporting portion 63, the upper edge portion of the glass plate 2 cannot be engaged with the restraining member 75. Therefore, the upper edge portion of the glass plate 2 slides through a portion lower than the lower end of the restraining groove 84 to be inserted into the clearances 74 arranged in the left-right direction.

The controller 100 refers to the signal input from the glass roll-in sensor 109 to determine whether or not the glass plate 2 has reached the storage position in the storage space 33. When the glass plate 2 is stored, the roller actuator 94 of the track robot 11 and the roller actuator 98 of the rack robot 13 are stopped to stop the slide movement of the glass plate 2. With this, the operation of carrying the glass plate 2 in the storage space 33 is completed.

Regarding the operations of the track robot 11 after the glass plate 2 is carried in the storage space 33, in the case of continuously carrying the next glass plate 2 in, the lift actuator 93 of the track robot 11 is activated to raise the lift bar 26 (see a reference sign T7 in FIG. 12). When the lift bar 26 reaches a predetermined position, the lift actuator 93 is stopped to stop the movement of the lift bar 26. Next, the flip actuator 92 is activated to lay the end-effector 23 (see the reference sign T8 in FIG. 12). When the end-effector 23 is laid to be located at the horizontal position, the flip actuator 92 is stopped to stop the swinging operation of the end-effector 23.

(Holding of Glass Plate)

After the glass plate 2 is carried in the storage space 33, the operation of changing the posture of the glass plate 2 is executed such that the glass plate 2 stands in a posture closer to the upright posture.

FIGS. 14A to 14D are action diagrams each showing the movement of the lower end portion of the glass plate 2 when changing the posture of the glass plate 2. FIGS. 15A to 15D are action diagrams each showing the movement of the upper edge portion of the glass plate 2 when changing the posture of the glass plate 2. As shown in FIG. 14A and FIG. 15A, before changing the posture of the glass plate 2, the lower edge portion of the glass plate 2 is being stored in the second groove 87 of the lower edge portion storage portion 64. The upper edge portion of the glass plate 2 is received in the clearance 74 and supported by a pair of support rollers 71 defining this clearance 74. However, the upper edge portion of the glass plate 2 is located lower than the lower end of the restraining member 75 and is not engaged with the restraining member 75.

Figure 14B:
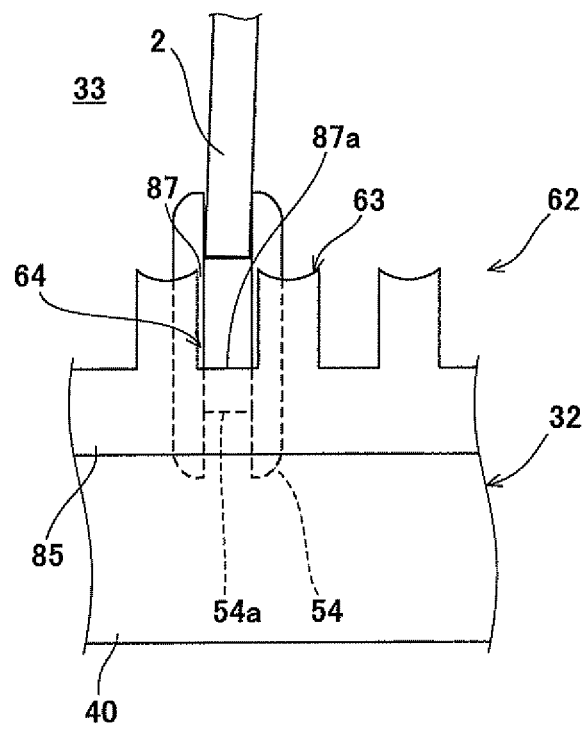
FIG. 14B is an action diagram showing a state where the glass plate is lifted up from below.
Figure 14B:
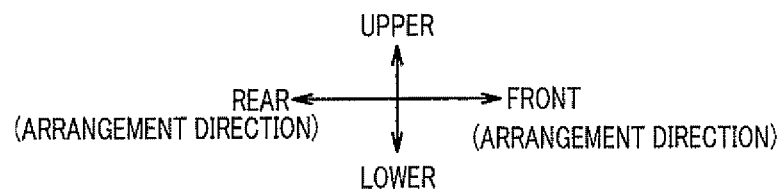
Figure 15B:
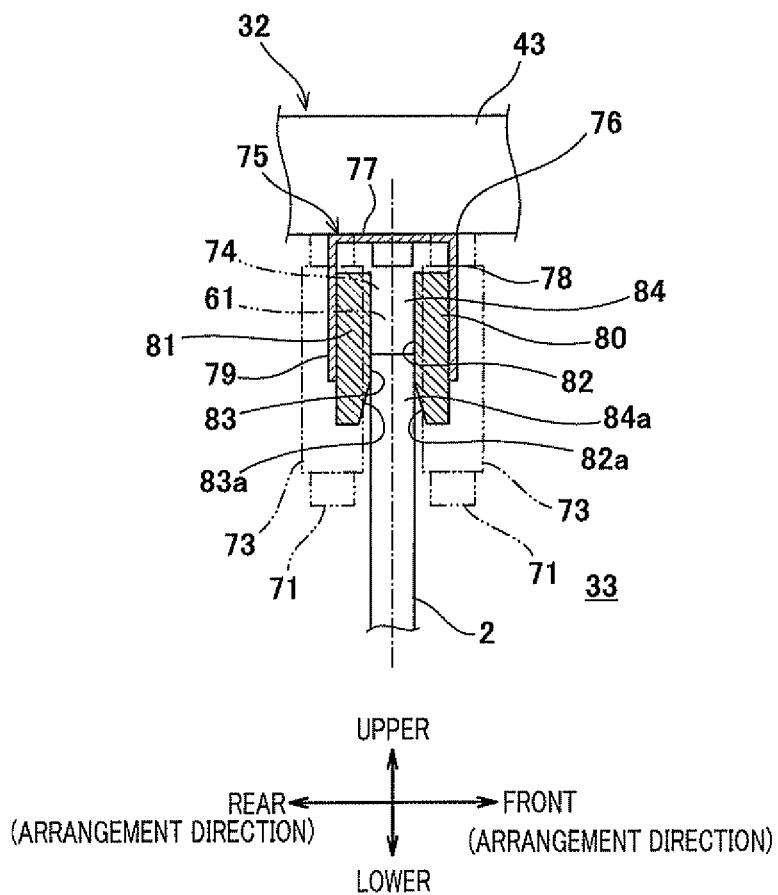
FIG. 15B is an action diagram showing a state where the glass plate is lifted up from below.

As shown in FIGS. 14B and 15B, when changing the posture of the glass plate 2, first, the lift actuator 97 of the rack robot 13 is activated to raise the roller beam 48 (see a reference sign R4 in FIG. 12). When the roller beam 48 reaches the posture changing position, the lift actuator 97 is stopped to stop the movement of the roller beam 48.

In the process of this raising operation, the lower edge portion of the glass plate 2 received in the groove 54a of the roller 54 is lifted up from below to be released from the second groove 87 of the lower edge portion storage portion 64 toward the upper direction. When the roller beam 48 is located at the posture changing position, the lower end portion of the glass plate 2 is located higher than an uppermost surface of the pad 85. As above, the lift actuator 97 of the rack robot 13 constitutes a first driving portion configured to cause the roller 54, serving as the supporting body, to move in the upper-lower direction.

The upper edge portion of the glass plate 2 also moves in the upper direction. With this, the upper edge portion of the glass plate 2 moves into the restraining groove 84 of the restraining member 75 from below. Since the front-rear-direction size of the lower end of the restraining groove 84 is larger than the front-rear-direction size of the clearance 74 as described above, the upper edge portion of the glass plate 2 can be easily caused to move into a lower portion of the restraining groove 84. Then, at the lower portion of the restraining groove 84, the upper edge portion of the glass plate 2 having passed through the lower end of the restraining groove 84 is guided by the tapered surfaces 82a and 83a toward a front-rear-direction middle portion of the restraining groove 84. Thus, the upper edge portion of the glass plate 2 smoothly moves into even a narrow portion of the restraining groove 84. Since the front-rear-direction size of the restraining groove 84 is equal to the thickness of the glass plate 2, a portion of the upper edge portion of the glass plate 2 is restrained by a pair of restraining pieces 80 and 81 in the front-rear direction, the portion having moved into the restraining groove 84.

Figure 14C:
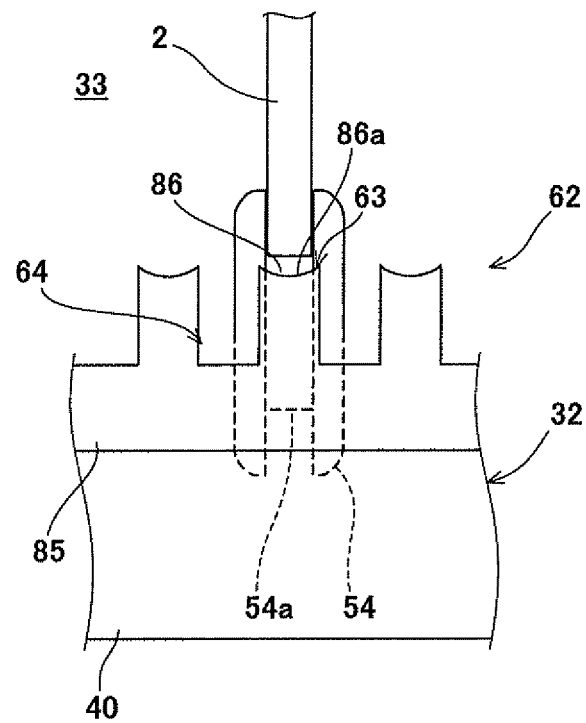
FIG. 14C is an action diagram showing a state where the glass plate is moved in an arrangement direction.
Figure 15C:
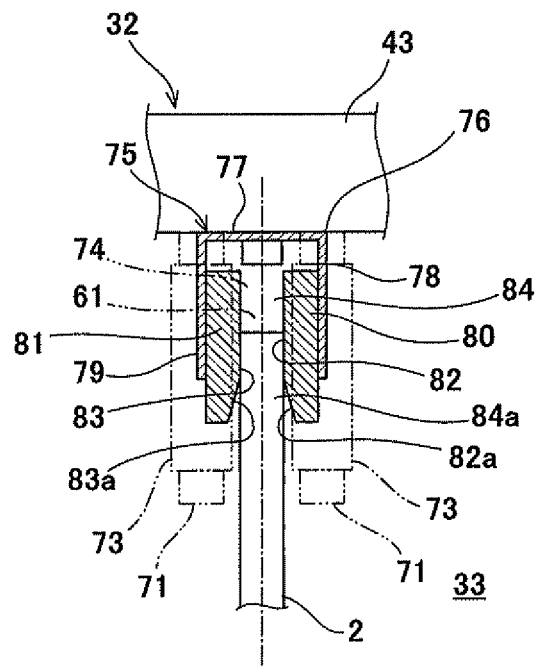
FIG. 15C is an action diagram showing a state where the glass plate is moved in the arrangement direction.
Figure 15C:
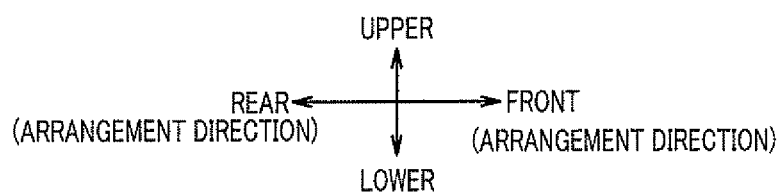

Next, as shown in FIGS. 14C and 15C, after the movement of the roller beam 48 in the upper direction is terminated, the slot actuator 96 of the rack robot 13 is activated to cause the rack robot 13 to move toward the front side that is a side where the clearance 74 in which the upper edge portion of the glass plate 2 is received is provided (see a reference sign R5 in FIG. 12). When the rack robot 13 moves until the groove 54a of the roller 54 is located above the first groove 86 of the lower supporting portion 63, the slot actuator 96 is stopped to stop the movement of the rack robot 13 in the front direction.

In the process of this movement in the front direction, the lower edge portion of the glass plate 2 is supported by the peripheral surface defining the groove 54a of the roller 54 whereas the upper edge portion of the glass plate 2 is restrained by the restraining member 75 in the front-rear direction. Therefore, the lower edge portion of the glass plate 2 moves in the front direction while maintaining a state where the lower edge portion of the glass plate 2 is being supported by the roller 54. The movement of the upper edge portion of the glass plate 2 in the front-rear direction is restrained, and the upper edge portion of the glass plate 2 slightly moves in the upper direction in the restraining groove 84. With this, the posture of the glass plate 2 gradually changes so as to be closer to the upright posture. As above, the slot actuator 96 of the rack robot 13 constitutes a second driving portion configured to cause the roller 54, serving as the supporting body, to move in the arrangement direction of the plate-shaped member.

In a state where the above movement in the front direction is completed, the first groove 86 of the lower supporting portion 63 is located immediately under the clearance 74 and the restraining groove 84, and the lower edge portion of the glass plate 2 is supported by the groove 54a of the roller 54 located above this first groove 86. Therefore, at a time when the base of the rack robot 13 is stopped, the glass plate 2 stands in a posture close to the upright posture.

Figure 14D:
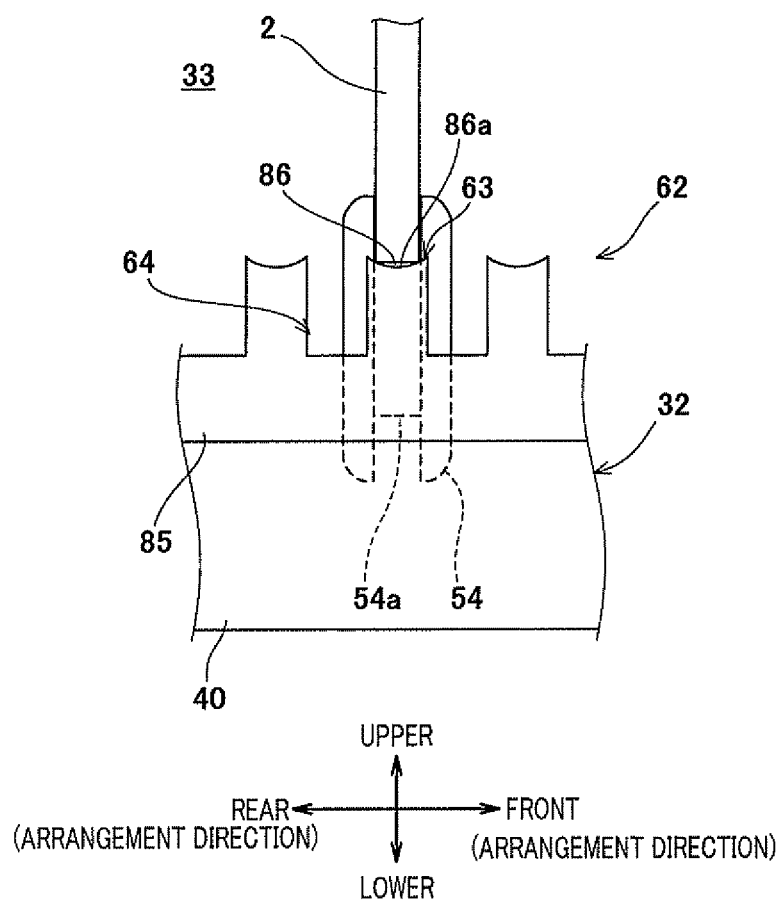
FIG. 14D is an action diagram showing a state where the glass plate is lifted down to be supported by the lower supporting portion.
Figure 15D:
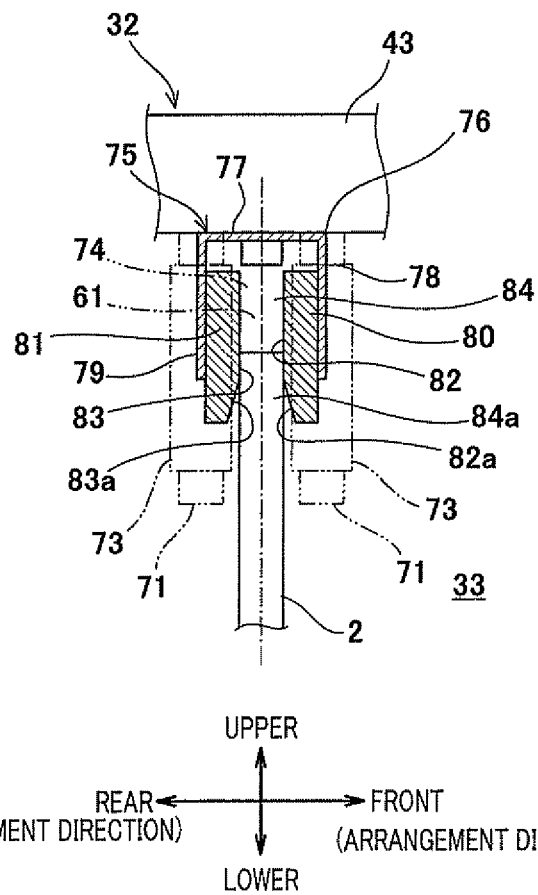
FIG. 15D is an action diagram showing a state where the glass plate is lifted down to be supported by the lower supporting portion.

Next, as shown in FIGS. 14D and 15D, after the movement of the rack robot 13 in the front direction is terminated, the lift actuator 97 of the rack robot 13 is activated to lower the roller beam 48 of the rack robot 13 (see a reference sign R6 in FIG. 12). When the roller beam is lowered to be located at the evacuation position, the lift actuator 97 of the rack robot 13 is stopped to stop the lowering operation of the roller beam 48. With this, the operation of changing the posture of the glass plate 2 in the storage space 33 is completed.

In the process of this lowering operation, since the glass plate 2 is heavy in weight, the glass plate 2 follows the lowering operation of the roller 54 by its own weight against the restraining force of the restraining member 75. Therefore, a state where the lower edge portion of the glass plate 2 is being received in the groove 54a of the roller 54 is maintained. By continuously lowering the roller beam 48, the lower edge portion of the glass plate 2 moves into the first groove 86 of the lower supporting portion 63 from above. Then, the lower edge portion of the glass plate 2 is supported on the first bottom surface 86a of the first groove 86. After that, even if the roller beam 48 is continuously lowered, the lower end portion of the glass plate 2 is separated from the rollers 54 to be maintained in a state of being supported on the first bottom surface 86a.

As described above, the first bottom surface 86a is located higher than the second bottom surface 87a of the lower edge portion storage portion 64 utilized when carrying the glass plate 2 in. Therefore, in a state where the lower edge portion of the glass plate 2 is supported on the first bottom surface 86a, the upper edge portion of the glass plate 2 can be kept in the restraining groove 84, and a state where the upper edge portion of the glass plate 2 is restrained by the restraining member 75 in the front-rear direction is maintained.

The lower edge portion storage portion 64 is located further from the upper supporting portion 61 than the lower supporting portion 63 in the arrangement direction. Therefore, the inclination of the glass plate 2 when the lower edge portion of the glass plate 2 is supported by the lower supporting portion 63 is smaller than that when the lower edge portion of the glass plate 2 is stored in the lower edge portion storage portion 64, so that the glass plate 2 stands in a posture closer to a vertical posture. By causing the lower supporting portion 63 to support the glass plate 2 having been carried in the storage space 33, the glass plate 2 can be caused to stand in a posture close to the vertical posture. By causing the glass plate 2 to stand in a posture closer to the vertical posture, the glass plate 2 can be held stably. For example, the glass plate 2 stored in the storage space 33 can be prevented from bending.

Especially, the pad 85 constituting the lower supporting portions 63 is produced from a material, such as PEEK resin or silicon rubber, having high friction coefficient. Since the glass plate 2 is heavy in weight, the high frictional force is generated between the lower edge portion of the glass plate 2 and the lower supporting portion 63 by the weight of the glass plate 2 itself, so that the lower edge portion of the glass plate 2 can be held strongly. In addition, since the lower supporting portion 63 includes the first grooves 86, and the lower edge portion of the glass plate 2 is received in the first groove 86, the lower edge portion of the glass plate 2 is held further strongly.

In a state where the lower edge portion of the glass plate 2 is held stably as above, and the glass plate 2 stands in a posture close to the vertical posture, the glass plate 2 may incline in the front or rear direction by using the lower edge portion as a fulcrum by the application of an external force in the front or rear direction. In the present embodiment, since the upper edge portion of the glass plate 2 is supported by a pair of support rollers 71 and further restrained by the restraining member 75 in the front-rear direction, a state where the glass plate 2 stands in a posture close to the vertical posture can be maintained stably.

In addition, since the lower edge portion storage portion 64 is located lower than the lower supporting portion 63, the restraining member 75 does not restrain the glass plate 2 when carrying the glass plate 2 in by utilizing the lower edge portion storage portion 64. Therefore, even though the member for restraining the glass plate 2 is provided, the glass plate 2 can be smoothly carried in. Moreover, an operational advantage of exercising the action of the restraining member 75 when it is necessary and not exercising the action when it is not necessary is realized by a simple structure in which the lower edge portion storage portion 64 utilized when the glass plate 2 is carried in and the lower supporting portion 63 utilized after the glass plate 2 is carried in are different in position from each other in the upper-lower direction.

Then, since the operation of changing the posture of the glass plate 2 is automatically performed by the rack robot 13, workers of the plant 1 are not burdened. In addition, the rack robot 13 includes the rollers 54 each capable of moving up and down, moving in the front-rear direction, and rotating about an axis extending in the front-rear direction, and the roller 54 serves as the supporting body configured to support the lower edge portion of the glass plate 2. With this, the rack robot 13 is used to carry the glass plate 2 in the storage space 33, change the posture of the glass plate 2, and detect the storage place of the glass plate 2. As above, when storing one glass plate 2 in the storage space 33, one rack robot 13 plays various roles, so that the entire configuration of the rack 12 can be simplified.

As above, in the storage space 33 of the rack 12, a plurality of glass plates 2 stand in a posture close to the vertical posture and are arranged so as to be adjacent to one another in the thickness direction, and the upper edge portions and lower edge portions of the glass plates 2 are held strongly. Therefore, even if the rack main body 32 storing the glass plates 2 is conveyed, the glass plates 2 can be prevented from bending and being vibrated during this conveying operation. On this account, the operation of conveying the glass plates 2, stored in the rack 12, to the processing device 4 can be performed by utilizing a cargo handling machine, such as the forklift 9. Thus, the burdens on the workers of the plant 1 can be reduced significantly, and the production efficiency of the plant 1 can be improved.

[Modification Example of Frame Structure]

In the above embodiment, in order to convey the rack main body 32 storing the glass plates 2, the fork pockets 45 into which the forks of the forklift 9 are inserted are provided. However, in order to achieve the same effect, for example, the rack main body may be configured to be slidable on the base.

Figure 16:
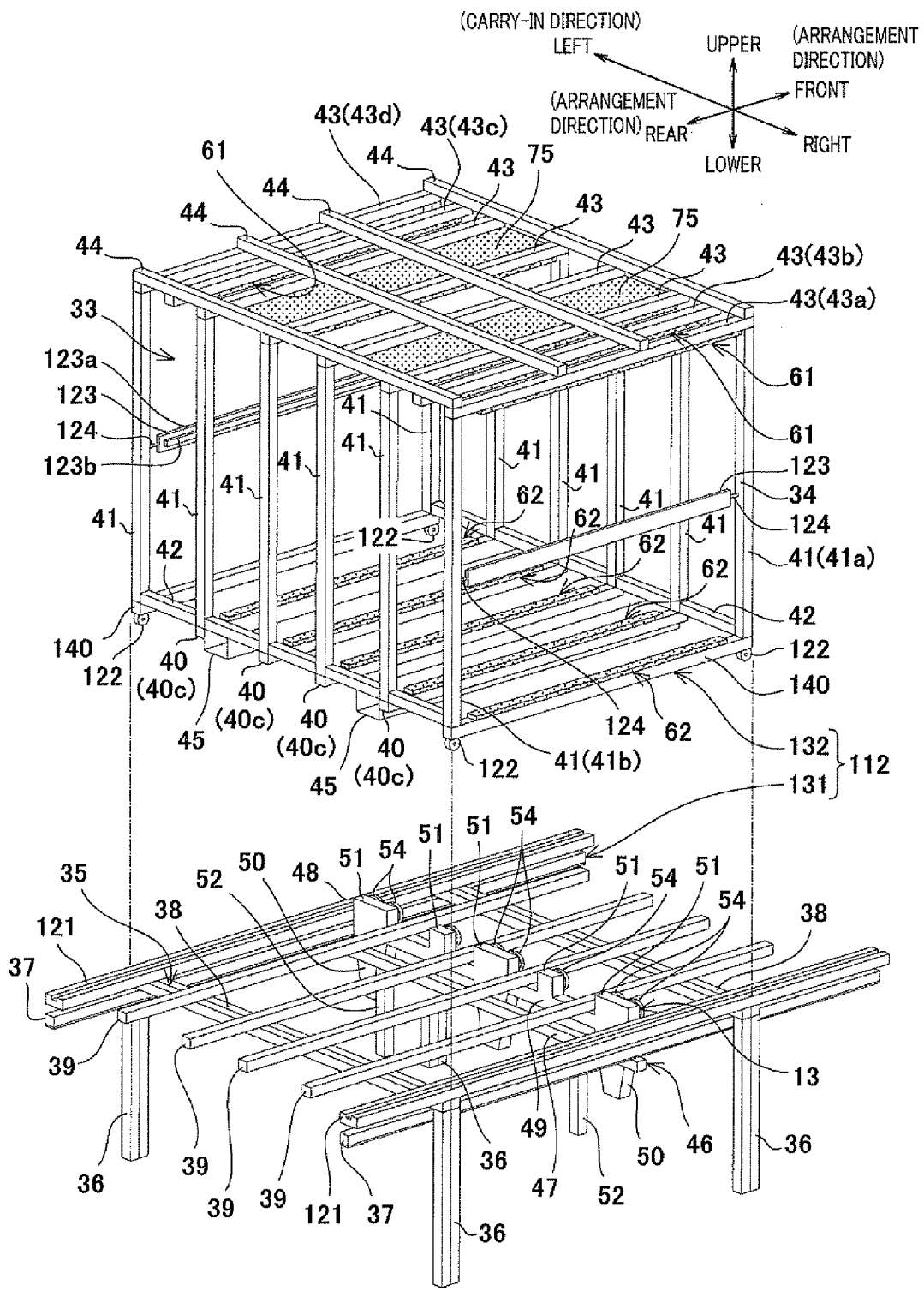
FIG. 16 is an exploded perspective view showing a part of the rack according to Modification Example.

In the present modification example, as shown in FIG. 16, a pair of left and right rails 121 extending in the front-rear direction are respectively fixed to left and right edge portions of a bed portion 135 of a base 131. Rollers 122 are respectively provided at front end portions and rear end portions of lower surfaces of bottom vertical girders 140 respectively located at left and right end edges among bottom vertical girders constituting the bottom portion of a rack main body 132. When the rack main body 132 is supported on the base 131, the rollers 122 are received in the rails 121 so as to be rotatable. With this, the rack main body 132 can slide on the base 131 along the rails 121 in the front-rear direction.

Moreover, as shown in FIG. 16, the rack 112 may be provided with side clampers 123 for restraining side edge portions of the glass plates 2. Each of the side clampers 123 is provided between posts provided at a left or right end edge of the rack 112. For example, the side clamper 123 includes a band-shaped base plate 123a and a buffer member 123b, such as silicon rubber, having elasticity (that is, vibration resistance). The buffer member 123b is attached to a flat surface of the base plate 123a, the flat surface facing the storage space 33. The side clampers 123 are provided such that the buffer members 123b contact the side edge portions of the glass plates 2 stored in the storage space 33. With this, the effect of preventing the glass plate 2 from bending and being vibrated can be improved.

It is preferable that: the side clampers 123 be detachably provided; and the side clampers 123 be attached before the rack main body 132 storing the glass plates 2 is conveyed by the forklift 9 or the slide movement on the base 131. With this, the operation of carrying the glass plate 2 in the storage space 33 and the operation of changing the posture of the glass plate 2 in the storage space 33 are not disturbed. It is preferable that in order that the side clamper 123 can be detached from the rack 112 as above, the posts 41 of the rack main body 132 be provided with locking members 124, such as hooks, configured to lock the base plates 123a of the side clampers 123.

[Modification Example of Restraining Member]

Figure 17:
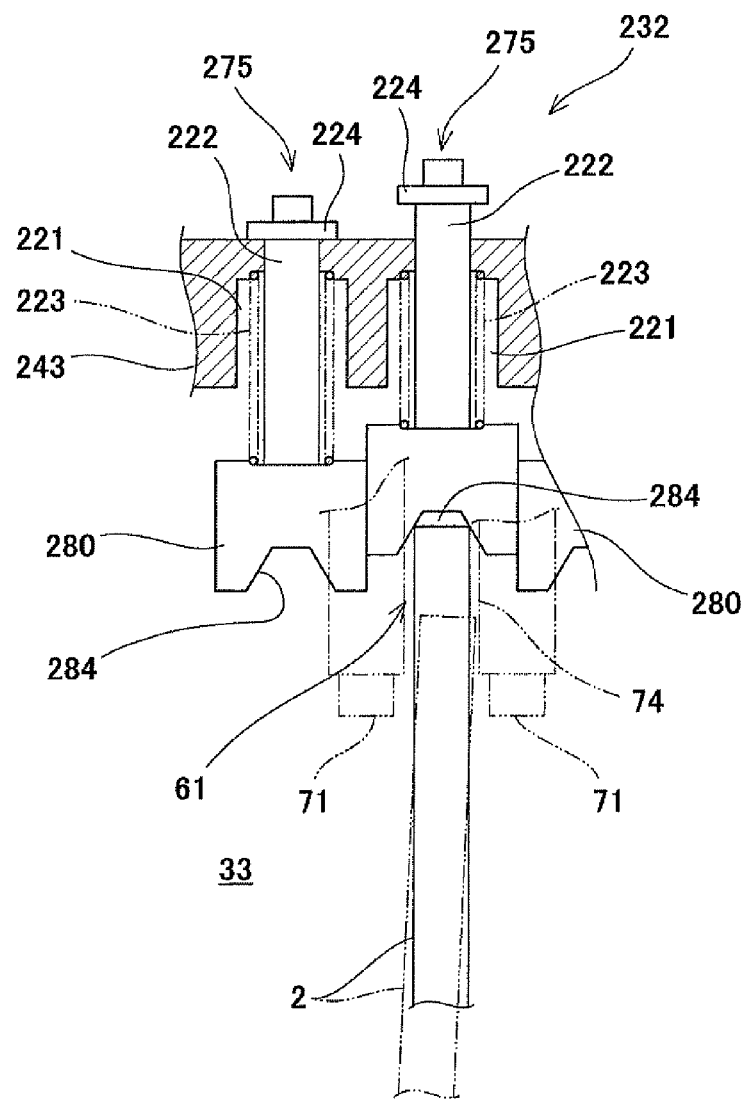
FIG. 17 is a diagram showing a restraining member according to Modification Example.
Figure 17:
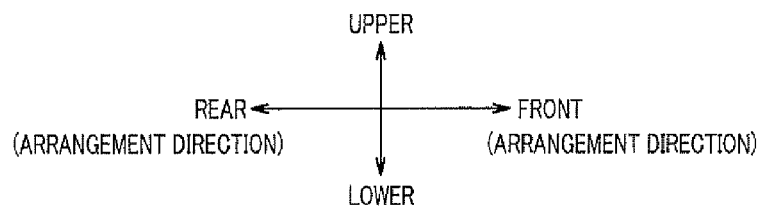

FIG. 17 shows a modification example of a restraining member 275. As shown in FIG. 17, the restraining member 275 includes a shank 222 inserted from an upper side of an upper vertical girder 243 of a rack main body 232 through a through hole 221 penetrating the upper vertical girder 243 in the upper-lower direction. A lower end portion of the shank 222 is located in the storage space 33 located at a lower surface side of the upper vertical girder 243. A restraining piece 280 having a substantially rectangular cross section is fixed to the lower end portion of the shank 222. A restraining groove 284 extending in the left-right direction is formed on a lower surface of the restraining piece 280. An upper portion and lower portion of the through hole 221 formed in the upper vertical girder 243 are different in diameter from each other, and the upper portion thereof is larger in diameter than the lower portion thereof. A coil spring 223 is accommodated in the large-diameter lower portion of the through hole 221. The coil spring 223 is provided to externally surround the shank 222. One axial end portion of the coil spring 223 is fixed to a ring-shaped spring seat formed at a boundary between the upper and lower portions of the through hole 221, and the other axial end portion thereof is fixed to an upper surface of the restraining piece 280. The restraining piece 280 and the shank 222 are biased in the lower direction by the coil spring 223. A flange portion 224 projecting in a radial direction is formed at an upper end portion of the shank 222. The flange portion 224 is smaller in diameter than the upper portion of the through hole 221. Therefore, the downward movements of the shank 222 and restraining piece 280 biased by the coil spring 223 are normally regulated by the contact between the flange portion 224 and an upper surface of the upper vertical girder 243.

Even in a case where the restraining member 275 configured as above is provided, the lower edge portion storage portion is utilized when carrying the glass plate 2 in. In this case, the upper edge portion of the glass plate 2 is located lower than the restraining groove 284 of the restraining piece 280. After the glass plate 2 is carried in, the lower edge portion of the glass plate 2 is supported by the lower supporting portion. With this, the upper edge portion of the glass plate 2 is moved in the upper direction. At this time, the upper edge portion of the glass plate 2 moves into the restraining groove 284 from below and causes the restraining piece 280 and the shank 222 to move in the upper direction against the biasing force of the coil spring 223. When the lower edge portion of the glass plate 2 is supported by the lower supporting portion, the coil spring 223 becomes a compressed state. With this, the glass plate 2 is pushed in the lower direction by the biasing force of the coil spring 223. As above, in the present modification example, the standing glass plate 2 can be restrained in the upper-lower direction by utilizing the biasing force of the coil spring 223.

[Modification Example of Lower Supporting Portion]

Figure 18:
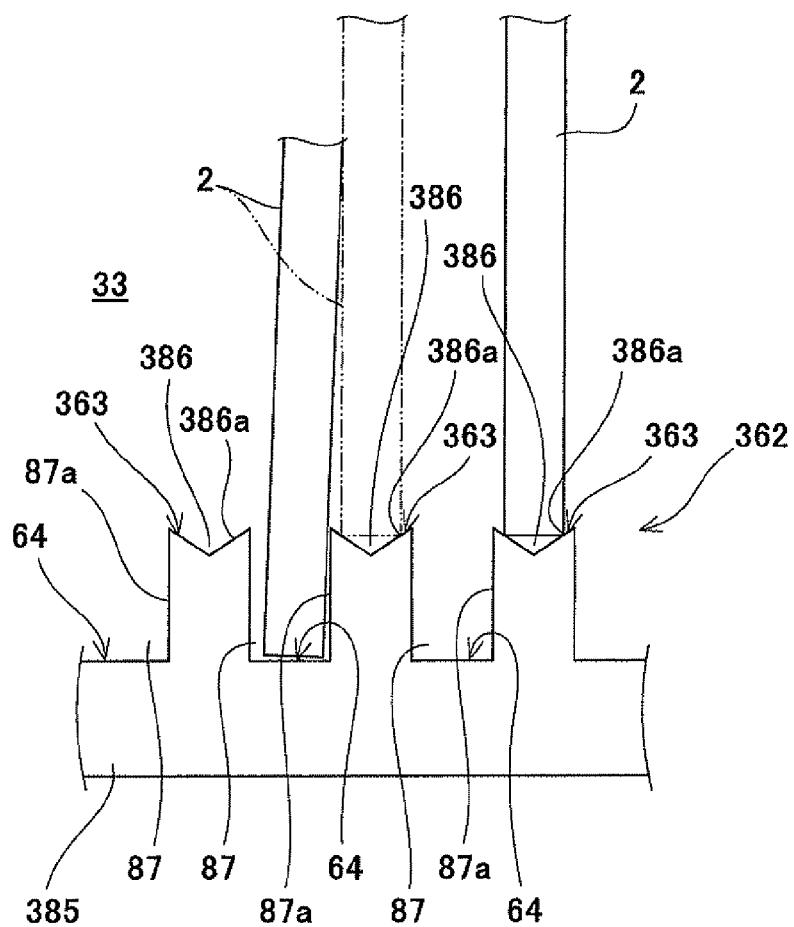
FIG. 18 is a diagram showing a support storage portion according to Modification Example.
Figure 18:
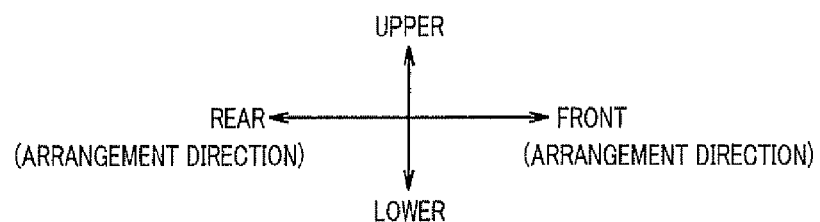
Figure 19:
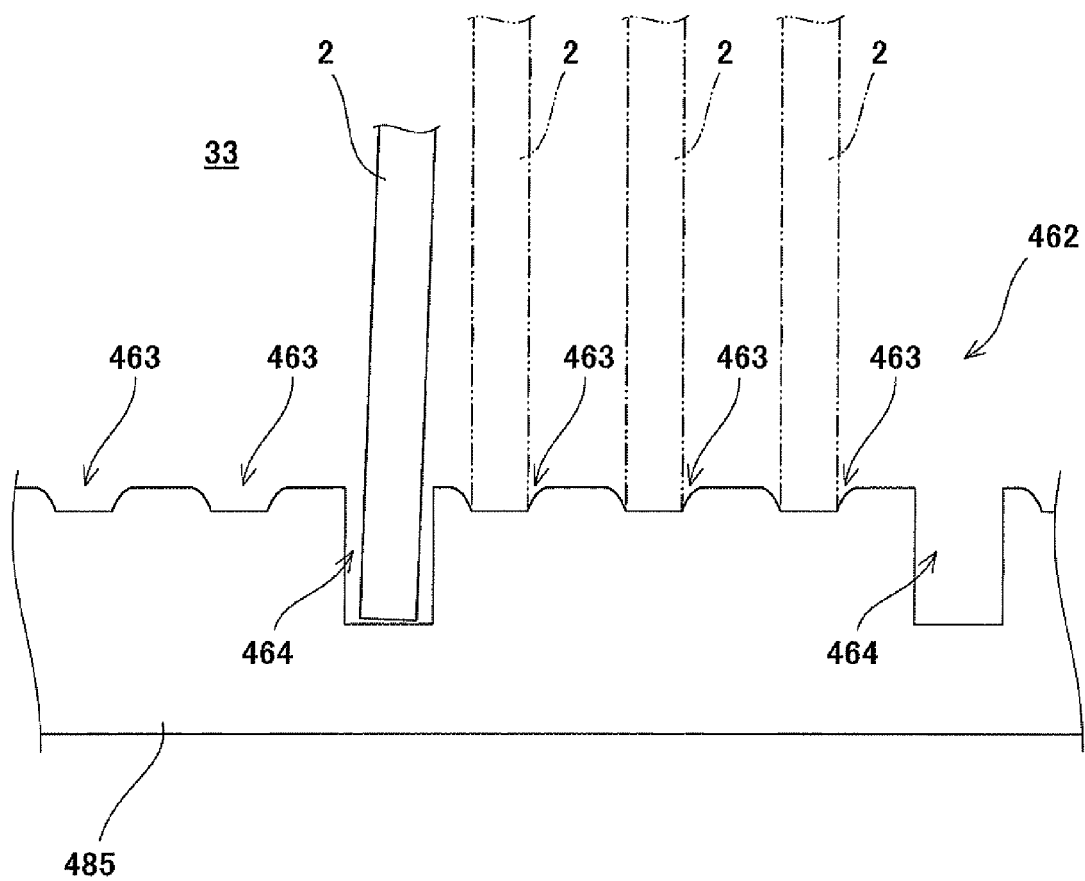
FIG. 19 is a diagram showing the support storage portion according to Modification Example.
Figure 19:
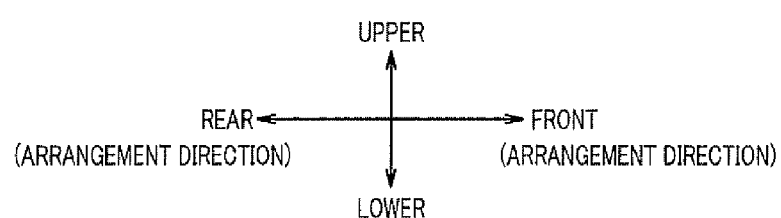
Figure 20:
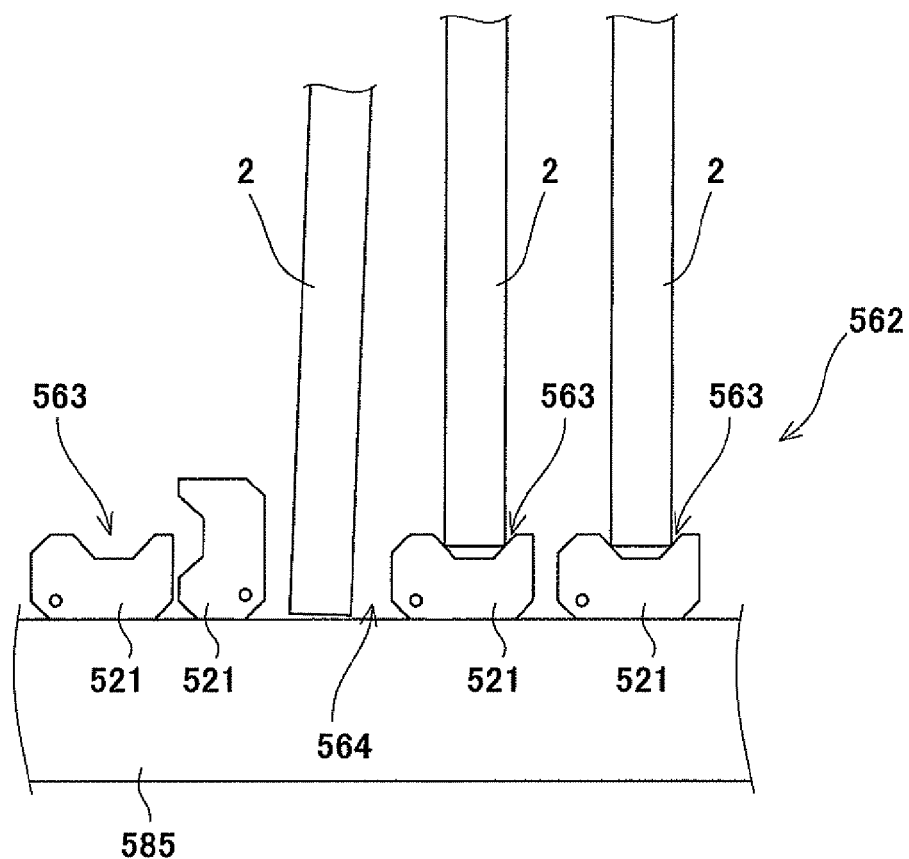
FIG. 20 is a diagram showing the support storage portion according to Modification Example.
Figure 20:
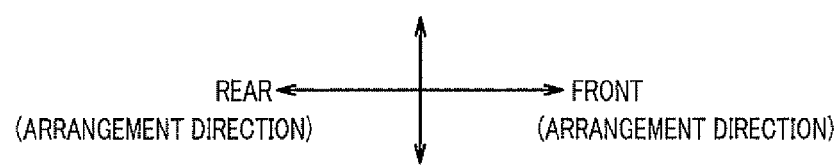

FIGS. 18 to 20 respectively show modification examples of support storage portions 362, 462, and 562. In the above embodiment, the first groove 86 of the lower supporting portion 63 has a circular-arc cross-sectional shape. However, each of the cross-sectional shapes of a first groove 386 and first bottom surface 386a is not limited to the above and may be a V shape as shown in FIG. 18. In addition, the shapes of the groove 87 and second bottom surface 87a of the lower edge portion storage portion 64 may be suitably changed.

The lower supporting portion shown in FIG. 19 is more preferable than that of the above embodiment shown in FIG. 6. To be specific, in the above embodiment, each of the number of lower supporting portions 63 and the number of lower edge portion storage portions 64 is equal to the number of glass plates 2 to be stored in the rack 12. However, in FIG. 19, the number of lower edge portion storage portions 64 is smaller than that of the above embodiment. Specifically, without changing the number of lower supporting portions 463, one lower edge portion storage portion 464 is provided so as to correspond to some lower supporting portions 463 (three lower supporting portions 463 in the present embodiment). To be specific, the lower supporting portions 463, the number (N, for example) of which is equal to the number of glass plates 2 the rack can store are divided into one or more (to be specific, N/n) groups each including two or more (n, for example; and n=3 in the present embodiment) lower supporting portions 463 sequentially arranged in the arrangement direction, and these groups are provided so as to correspond one-to-one to the lower edge portion storage portions 464. With this, the number of lower edge portion storage portions 464 can be reduced to a number corresponding to the inverse (1/n) of the number of lower supporting portions 463 included in each group. Thus, when storing the same glass plates 2, the size of the storage space 33 can be reduced in the arrangement direction of the glass plates 2. In other words, the number of glass plates 2 to be stored per unit size in the arrangement direction in the storage space 33 can be increased. Moreover, FIG. 19 clearly shows by a plurality of grooves arranged in the arrangement direction of the glass plates 2 that two or more lower supporting portions 463 are included in each of the groups. Thus, by the configuration in which each lower supporting portion 463 includes the groove, the lower edge portion of the standing glass plate 2 can be strongly supported as with the above embodiment.

Moreover, as shown in FIG. 20, block-shaped swinging members 521 may be provided on bottom vertical girders 540, and a state where a lower edge portion storage portion 564 utilized during the conveyance operation is formed and a state where a lower supporting portion 563 utilized after the conveyance operation is formed may be switched in accordance with the swinging position of the swinging member 521. The swinging member 521 may be manually operated or automatically operated by utilizing the operation of the rack robot 13.

In a case where the first bottom surface, on which the glass plate 2 is supported, of the lower supporting portion 63 is located higher than the second bottom surface of the lower edge portion storage portion 64, the lower supporting portion 63 does not have to have a groove.

The foregoing has explained the embodiment and modification examples of the present invention. However, from the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the spirit of the present invention. The transfer facility according to the present invention is preferably provided in a plant for producing the other plate-shaped member, such as a liquid crystal panel. In addition, the plate-shaped member according to the present invention is not limited to the glass plate 2 that is a substrate and may be a solar panel or a liquid crystal panel that is a finished product.

INDUSTRIAL APPLICABILITY

The present invention can realize both stably conveying the plate-shaped members in the standing posture and stably holding the plate-shaped members, stored in the rack, in the standing posture. Thus, the present invention is useful when it is applied to a device and method for storing large-size heavy-weight plate-shaped members, such as solar panels and glass plates that are substrates of the solar panels.

REFERENCE SIGNS LIST

2 glass plate (plate-shaped member)
10 transfer facility
11 track robot (transfer device)
12 rack
13 rack robot (posture changing mechanism)
31 base
32 rack main body
33 storage space
34 carry-in opening
54 roller (supporting body)
61 upper supporting portion
62 support storage portion
63 lower supporting portion
64 lower edge portion storage portion
71 support roller
74 clearance
75 restraining member
80, 81 restraining piece
82, 83 opposed surface
82a, 83a tapered surface
84 restraining groove
85 pad
86 first groove
86a first bottom surface
87 second groove
87a second bottom surface
94 roller actuator
96 slot actuator (second driving portion)
97 lift actuator (first driving portion)
98 roller actuator

The invention claimed is:
1. A plate-shaped member transfer facility comprising:
a rack main body including a storage space and a carry-in opening,
the storage space being configured to store a plurality of plate-shaped members such that the plurality of plate-shaped members stand and are arranged in an arrangement direction so as to be adjacent to one another in a thickness direction of the plate-shaped member, and
the carry-in opening being an opening through which the plate-shaped members are carried in the storage space in a horizontal carry-in direction intersecting with the arrangement direction;
a transfer device configured to carry the plate-shaped members in the storage space through the carry-in opening;
a plurality of upper supporting portions provided in the storage space in the arrangement direction when viewed from the carry-in direction;

lower supporting portions provided in the storage space, each lower supporting portion respectively located under an upper supporting portion;

lower edge portion storage portions provided in the storage space, each lower edge portion storage portion located at an outer side of an end of the upper supporting portion and an end of the lower supporting portion in the arrangement direction;

a posture changing mechanism provided at a lower portion of the rack main body and including supporting bodies which are movable upward, downward, and in the arrangement direction; and a controller configured to control the transfer device and the posture changing device, wherein:

the controller causes the transfer device to:

carry the plate-shaped member in the storage space through the carry-in opening in the carry-in direction in a state where the plate-shaped member is inclined such that an upper edge portion of the plate-shaped member is supported by one of the upper supporting portions and a lower edge portion of the plate-shaped member is stored in the lower edge portion storage portion corresponding to the one of the upper supporting portions, and the controller causes the posture changing mechanism to:

cause the supporting bodies to support the lower edge portion of the plate-shaped member stored in the lower edge portion storage portion, cause the supporting bodies to move up and lift up the plate-shaped member from below, cause the supporting bodies to move in the arrangement direction, and mount the lower edge portion, from the supporting bodies, onto the lower portion corresponding to the one of the upper supporting portions.

2. The plate-shaped member transfer facility according to claim 1, further comprising:

restraining members, each restraining member respectively provided at the same position as an upper supporting portion in the arrangement direction when viewed from the carry-in direction, wherein each of the restraining members is provided on the rack main body so as not to be engaged with the plate-shaped member when the lower edge portion of the plate-shaped member is stored in the lower edge portion storage portion and so as to restrain the upper edge portion of the plate-shaped member when the lower edge portion of the plate-shaped member is being supported by the lower supporting portion.

3. The plate-shaped member transfer facility according to claim 2, wherein:

each of the restraining members includes a pair of restraining pieces spaced apart from each other in the arrangement direction; and the upper edge portion of the plate-shaped member supported by the lower supporting portion is fitted in a restraining groove formed between the pair of restraining pieces to be restrained by the pair of restraining pieces.

4. The plate-shaped member transfer facility according to claim 3, wherein:

each restraining piece of the pair of restraining pieces includes opposed surfaces opposed to each other; and a tapered surface is formed on a lower end portion of at least one of the opposed surfaces such that a size of the restraining groove in the arrangement direction increases toward a lower direction.

5. The plate-shaped member transfer facility according to claim 1, wherein the lower edge portion storage portions are located lower than the lower supporting portions.

6. The plate-shaped member transfer facility according to claim 1, wherein each lower supporting portion includes grooves with which the lower edge portions of the plate-shaped members are respectively engaged.

7. The plate-shaped member transfer facility according to claim 1, wherein:

the number of lower supporting portions corresponds to the number of plate-shaped members the storage space is able to store;

the lower supporting portions, the number of which corresponds to the number of plate-shaped members the storage space is able to store, are divided into one or more groups each including two or more lower supporting portions sequentially arranged in the arrangement direction; and the groups are provided so as to correspond one-to-one to the lower edge portion storage portions.

8. The plate-shaped member transfer facility according to claim 1, wherein the posture changing mechanism includes a first driving portion, configured to cause the supporting body to move in an upper-lower direction, and a second driving portion, configured to cause the supporting body to move in the arrangement direction.

9. The plate-shaped member transfer facility according to claim 1, further comprising a base configured to slidably support a bottom portion of the rack main body.

10. A method of storing plate-shaped members in a plate-shaped member storage rack, the plate-shaped member storage rack including:

a rack main body including a storage space and a carry-in opening, the storage space being configured to store a plurality of plate-shaped members such that the plurality of plate-shaped members stand and are arranged in an arrangement direction so as to be adjacent to one another in a thickness direction of the plate-shaped member, and the carry-in opening being an opening through which the plate-shaped members are carried in the storage space in a horizontal carry-in direction intersecting with the arrangement direction;

a plurality of upper supporting portions provided in the storage space in the arrangement direction when viewed from the carry-in direction;

lower supporting portions provided in the storage space, each lower supporting portion respectively located under an upper portion; and lower edge portion storage portions provided in the storage space, each lower edge portion storage portion located further from an upper supporting portion than a lower supporting portion in the arrangement direction;

the method comprising the steps of:

carrying the plate-shaped member in the storage space through the carry-in opening in the carry-in direction such that the upper edge portion of the standing plate-shaped member is supported by the upper supporting portion and the lower edge portion of the plate-shaped member is stored in the lower edge portion storage portion;

lifting up the plate-shaped member, having been stored in the storage space, from the lower edge portion storage portion;

causing the lower edge portion of the plate-shaped member to move in the arrangement direction; and lowering the plate-shaped member to cause the lower supporting portion to support the lower edge portion of the plate-shaped member.

* * * * *